US011623865B2

(12) United States Patent
Smith et al.

(10) Patent No.: US 11,623,865 B2
(45) Date of Patent: Apr. 11, 2023

(54) CONTINUOUS BORON NITRIDE NANOTUBE FIBERS

(71) Applicant: BNNT, LLC, Newport News, VA (US)

(72) Inventors: Michael W. Smith, Newport News, VA (US); Jonathan C. Stevens, Williamsburg, VA (US); Kevin C. Jordan, Newport News, VA (US); R. Roy Whitney, Newport News, VA (US)

(73) Assignee: BNNT, LLC, Newport News, VA (US)

( * ) Notice: Subject to any disclaimer, the term of this patent is extended or adjusted under 35 U.S.C. 154(b) by 65 days.

(21) Appl. No.: 16/878,764

(22) Filed: May 20, 2020

(65) Prior Publication Data

US 2020/0277188 A1 Sep. 3, 2020

Related U.S. Application Data

(63) Continuation of application No. 16/167,916, filed on Oct. 23, 2018, now Pat. No. 10,696,551, and a
(Continued)

(51) Int. Cl.
*C01B 21/064* (2006.01)
*C01B 35/14* (2006.01)
(Continued)

(52) U.S. Cl.
CPC .......... *C01B 21/0641* (2013.01); *B82Y 30/00* (2013.01); *C01B 35/146* (2013.01);
(Continued)

(58) Field of Classification Search
CPC .... C01B 21/0641; C01B 35/146; B82Y 30/00
See application file for complete search history.

(56) References Cited

U.S. PATENT DOCUMENTS

| 3,216,942 A | 11/1965 | Wentorf |
| 3,352,637 A | 11/1967 | Heymer |

(Continued)

FOREIGN PATENT DOCUMENTS

| CA | 2689629 A1 | 2/2009 |
| KR | 2011-0113201 | 10/2011 |

(Continued)

OTHER PUBLICATIONS

Gnoffo, et al., "Modeling of Laser Vaporization and Plume Chemistry in a Boron Nitride Nanotube Production Rig" *NASA Technical Reports Server (NTRS) 20120011733*, 23 pages, Jun. 25, 2012 (Jun. 25, 2012), accessed online at https://archive.org/details/NASA NTRS Archive 20120011733.

(Continued)

*Primary Examiner* — Joseph A Miller, Jr.
(74) *Attorney, Agent, or Firm* — Joshua B. Brady; Nixon & Vanderhye, P.C.

(57) ABSTRACT

Described herein are apparatus, systems, and methods for the continuous production of BNNT fibers, BNNT strands and BNNT initial yarns having few defects and good alignment. BNNTs may be formed by thermally exciting a boron feedstock in a chamber in the presence of pressurized nitrogen. BNNTs are encouraged to self-assemble into aligned BNNT fibers in a growth zone, and form BNNT strands and BNNT initial yarns, through various combinations of nitrogen gas flow direction and velocities, heat source distribution, temperature gradients, and chamber geometries.

18 Claims, 17 Drawing Sheets

Related U.S. Application Data continuation of application No. 15/305,994, filed as application No. PCT/US2015/027570 on Apr. 24, 2015, now Pat. No. 10,167,195.

(60) Provisional application No. 62/101,318, filed on Jan. 8, 2015, provisional application No. 62/101,323, filed on Jan. 8, 2015, provisional application No. 61/983,674, filed on Apr. 24, 2014.

(51) Int. Cl.
  *H01L 21/00* (2006.01)
  *B82Y 30/00* (2011.01)
  *D01F 9/08* (2006.01)
  *H01L 23/373* (2006.01)
  *B82Y 40/00* (2011.01)

(52) U.S. Cl.
  CPC .............. *D01F 9/08* (2013.01); *H01L 21/00* (2013.01); *H01L 23/3731* (2013.01); *B82Y 40/00* (2013.01); *C01P 2004/13* (2013.01); *H01L 23/373* (2013.01); *H01L 2924/0002* (2013.01); *Y10S 977/762* (2013.01); *Y10S 977/891* (2013.01)

(56) References Cited

U.S. PATENT DOCUMENTS

| | | | |
|---|---|---|---|
| 5,305,612 A | 4/1994 | Higham | |
| 5,593,740 A | 1/1997 | Strumban | |
| 5,932,294 A | 8/1999 | Colombo | |
| 6,967,011 B1 | 11/2005 | Saboungi et al. | |
| 7,335,890 B2 | 2/2008 | Utterback | |
| 7,582,880 B2 | 9/2009 | Wallace | |
| 7,927,525 B2 | 4/2011 | Lizotte | |
| 8,206,674 B2 | 6/2012 | Smith | |
| 8,309,242 B2 | 11/2012 | Wei | |
| 8,673,120 B2 | 3/2014 | Whitney et al. | |
| 8,703,023 B2 | 4/2014 | Sainsbury | |
| 2002/0113335 A1 | 8/2002 | Lobovsky | |
| 2005/0112051 A1* | 5/2005 | Liu | B82Y 30/00 423/447.1 |
| 2005/0116336 A1 | 6/2005 | Chopra | |
| 2005/0118090 A1 | 6/2005 | Shaffer | |
| 2005/0155358 A1 | 7/2005 | Ash | |
| 2005/0237442 A1 | 10/2005 | Yamazaki | |
| 2006/0173397 A1 | 8/2006 | Tu | |
| 2007/0004225 A1 | 1/2007 | Lu | |
| 2007/0237959 A1* | 10/2007 | Lemaire | B82Y 40/00 428/408 |
| 2008/0083970 A1* | 4/2008 | Kamber | C30B 29/403 257/615 |
| 2008/0138577 A1 | 6/2008 | Sheehan | |
| 2008/0187657 A1 | 8/2008 | Altan | |
| 2008/0191395 A1 | 8/2008 | Johnson | |
| 2008/0296559 A1 | 12/2008 | Kreupl | |
| 2009/0117021 A1 | 5/2009 | Smith | |
| 2010/0108276 A1 | 5/2010 | Kuwahara | |
| 2010/0192535 A1 | 8/2010 | Smith et al. | |
| 2011/0104534 A1 | 5/2011 | Wei | |
| 2011/0140318 A1 | 6/2011 | Reeves | |
| 2011/0143915 A1 | 6/2011 | Yin | |
| 2011/0212308 A1 | 9/2011 | Brown | |
| 2012/0045688 A1 | 2/2012 | Liu | |
| 2012/0168299 A1 | 7/2012 | Whitney | |
| 2012/0199747 A1 | 8/2012 | Letant | |
| 2013/0064750 A1 | 3/2013 | Zettl | |
| 2013/0099264 A1 | 4/2013 | Zimmerman | |
| 2013/0144576 A1 | 6/2013 | Gnoffo et al. | |
| 2014/0364529 A1 | 12/2014 | Park et al. | |
| 2015/0033937 A1 | 2/2015 | Lashmore | |
| 2015/0125374 A1 | 5/2015 | Smith et al. | |

FOREIGN PATENT DOCUMENTS

| | | |
|---|---|---|
| WO | 2009/017526 | 2/2009 |
| WO | 2012/096775 | 7/2012 |
| WO | 2012/108941 | 8/2012 |
| WO | 2013082117 | 6/2013 |
| WO | 2014169382 | 10/2014 |
| WO | 2015164777 | 10/2015 |

OTHER PUBLICATIONS

European Extended Search Report dated Feb. 2, 2017 in Corresponding Application EP 15 78 3501.
Korean Preliminary Office Action dated Mar. 7, 2017 in KR Application No. 10-2016-7031895 with English language translation of the same.
Canadian Office Action dated Nov. 17, 2016 in CA Application No. 2945977.
Australian Examiner's First Patent Examination Report dated Oct. 25, 2016 in Australian Patent Application No. 2015249316.
Nishiwaki et al., Atomic structures and formation mechanism of boron nitride nanotubes and nanohorns synthesized by arc-melting LaB$_6$ powders; J. of the European Ceramic Society 26 (2006) 435-441.
Smith, et al., Very Long Single and Few-walled Boron Nitride Nanotubes via the Pressurized Vapor/Condenser Method, Nanotechnology, 2009.
Wang, et al., Recent Advancements in Boron Nitride Nanotubes, Nanoscale, 2010, 2, 2028-2034.
K.S. Kim, C.T. Kingston, A. Hrdina, M.B. Jakubinek, J. Guan, M. Plunkett and B. Simcard, ACS Nano, 2014, 8, 6211.
A. Fathalizadeh, T. Pham, W. Mickelson and A. Zetti, Nano Lett., 2014, 14, 4881.
International Search Report for PCT/US2014/63349, USPTO, dated Feb. 15, 2015.
International Search Report for PCT/US2015/27570, USPTO, dated Aug. 7, 2015.
International Search Report for PCT/US2015/058615, USPTO, dated Jan. 19, 2016.
International Search Report for PCT/US2016/032385, USPTO, dated Aug. 26, 2016.
International Search Report for PCT/US2016/023432, USPTO, dated May 26, 2016.
International Search Report for PCT/US2016/066464, USPTO, dated Apr. 11, 2016.
Su et al., Selective Growth of Boron Nitride Nanotubes by Plasma-Assisted and Iron-Catalytic CVD Methods, J. Phys. Chem., Jul. 22, 2009, 113, pp. 14681-14688. (cited in Feb. 15, 2015 Written Opinion for PCT/US2014/63349).
Mukhanov, et al., On Electrical Conductivity of Melts of Boron and Its Compounds Under Pressure, Journal of Superhard Materials, vol. 37, No. 4, 2015, pp. 289-291.
Hanafin, et al., Boron Fiber Neutron Shielding Properties, Specialty Materials, 2011 (Retrieved on Jul. 14, 2016) from Internet URL <http://www.specmaterials.com/pdfs/boronneutronshieldinQ.Pdf> p. 1.
Yu, et al., Dispersion of boron nitride nanotubes in aqueous solution with the help of ionic surfactants. Solid State Communications 149 (2009) 763-766. (Retrieved Jul. 14, 2016 from internet URL <http://dro.deakin.edu.au/view/ DU:30029180> pp. 763-766.
J-L. Cochon, et al. "A Continuous Wave CO2 Laser Reactor for Nanotube Synthesis", AIP Conference Proceedings 486, Jan. 1, 1999, pp. 237-240.

(56) References Cited

OTHER PUBLICATIONS

Maser, W. K. et al., "Production of Carbon Nanotubes: the light approach", Carbon, Elsevier, Oxford, GB, vol. 40, No. 10, Aug. 1, 2002, pp. 1685-1695.

Maser, W. K. et al., "Production of High-Density Single-Walled Nanotube Material by a Simple Laser-Ablation Method", Chemical Physics Letters, vol. 292, No. 4, 2002, pp. 587-593.

Extended European Search report for EP 19184253.3 dated Nov. 22, 2019.

* cited by examiner

CONTINUOUS BORON NITRIDE NANOTUBE FIBERS

CROSS REFERENCE TO RELATED APPLICATIONS

This application is a continuation of Ser. No. 16/167,916, filed Oct. 23, 2018 which is a continuation of U.S. patent application Ser. No. 15/305,994, filed Oct. 21, 2016, which is a U.S. National Stage of International Patent Application No. PCT/US15/027,570, filed Apr. 24, 2015, which claims the benefit of U.S. provisional patent application No. 61/983,674, filed Apr. 24, 2014; U.S. provisional patent application No. 62/101,318, filed Jan. 1, 2015; and U.S. provisional patent application No. 62/101,323, filed Jan. 8, 2015, each of which is incorporated by reference in its entirety.

STATEMENT REGARDING GOVERNMENT SUPPORT

None.

FIELD

The present disclosure generally relates to the continuous formation of boron nitride nanotube (BNNT) fibers, BNNT strands, and BNNT yarns.

BACKGROUND

Generally, BNNT structures may be formed by thermally exciting a boron feedstock in a chamber in the presence of nitrogen gas at an elevated pressure. Unlike carbon nanotubes (CNTs), U.S. Pat. No. 8,206,674 to Smith et al., incorporated by reference in its entirety, indicates that BNNTs form without the presence of chemical catalysts, and preferably at elevated pressures of about 2 atm to about 250 atm. CNTs, on the other hand, typically require the presence of chemical catalysts such as metal catalysts. It has been shown that BNNTs do not form in the presence of such catalysts, indicating that the formation of BNNTs is fundamentally different than the formation of CNTs.

Most contemporary BNNT synthesis methods have severe shortcomings, including one or more of having low yield, short tubes, discontinuous production, poor crystallinity (i.e., many defects in molecular structure), and poor alignment. Although there is no agreed upon standard in the scientific literature, the term 'high quality' BNNTs generally refers to long, flexible, molecules with few defects in the crystalline structure of the molecule. However, there are no known reports of the growth of continuous BNNT fibers or BNNT strands, particularly having few defects and good alignment. The BNNT "streamers" described in U.S. Pat. No. 8,206,674 to Smith et al., for example, form near a nucleation site such as the surface of the boron feedstock, but were limited to about 1 cm in length. BNNT "streamers" at such lengths are inadequate for producing BNNT yarns.

What is needed are apparatus, systems, and methods for the continuous production of BNNT fibers and BNNT strands, having few defects and good alignment.

BRIEF SUMMARY

This disclosure relates to apparatus, systems, and methods for the continuous production of BNNT fibers, BNNT strands and BNNT initial yarns, having few defects and good alignment. BNNTs may be formed by thermally exciting a boron feedstock in a chamber in the presence of pressurized nitrogen. BNNTs are encouraged to self-assemble into BNNT fibers in space near the boron feedstock, through various combinations of nitrogen gas flow direction and velocities, heat source distribution, temperature gradients, and chamber geometries.

BNNT fibers and BNNT strands may form BNNT initial yarns, which may be dry spun to form dry spun BNNT initial yarns. This disclosure describes apparatus and methods for forming and collecting BNNT yarns, and controlling various properties of the BNNT yarns. BNNT initial yarn may be collected and used to form BNNT yarn. BNNTs, BNNT fibers, BNNT strands, BNNT initial yarns and BNNT yarns have numerous potential applications. For instance, they may be used as heat transfer mediums, such as in the materials going into a diode, light-emitting diode, transistor or integrated circuit. They may also be used for adding structural strength and other advantageous properties to fabrics and composites such as ceramic, metal matrix and polymer based composites.

Embodiments may comprise a process for producing aligned BNNT fibers in which a boron feedstock is thermally excited in a chamber, such as by at least a laser; nitrogen gas is fed into the chamber at an elevated pressure; a heat distribution profile is established to form a BNNT growth zone in the chamber; and a shear force profile is established in the chamber to align BNNTs produced in and emerging from the growth zone. The process may proceed without catalysts in some embodiments, i.e. with no reactive feedstock other than boron and nitrogen. In some embodiments, thermally exciting the boron feedstock may form a boron melt. In some embodiments, establishing a shear force profile aligns BNNTs in an alignment direction, and nitrogen gas may be fed to the chamber in a direction that is generally aligned with alignment direction.

Generally, the BNNT growth zone is downstream of the boron feedstock, and represents the self-assembly region for initial BNNT structures. In some embodiments, a BNNT interference zone may be formed in the chamber downstream of the BNNT growth zone. An interference zone is a region in the chamber in which BNNTs become long enough to interfere with each other and form BNNT strands. Some embodiments may further include forming a BNNT stretch zone in the chamber downstream of the BNNT interference zone. In the stretch zone, BNNT strand structures stretch in length and decrease in diameter, and may form BNNT initial yarn.

In some embodiments, establishing a shear force profile in the chamber to align BNNTs produced in and emerging from the growth zone may include establishing a velocity distribution of the nitrogen gas in a plane perpendicular to the flow of the nitrogen gas that generates a desired level of BNNT alignment. A velocity distribution of the nitrogen gas may be established by adjusting one or more parameters, such as: setting a fan speed, establishing a heat distribution profile that generates a convective buoyancy about the boron feedstock, manipulating nitrogen gas pressure, increasing the volumetric flow rate of nitrogen gas in a portion of the chamber, cooling the nitrogen gas, and adjusting an insertion rate of nitrogen gas into the chamber. A nitrogen gas velocity distribution may be established in the interference zone, and in a plane perpendicular to the flow of the nitrogen gas, that generates a desired level of BNNT alignment.

In some embodiments, the volumetric flow rate of nitrogen gas in a portion of the chamber may be increased, such as by reducing a cross-sectional area of a portion of the chamber, introducing cowling into a portion of the chamber, and positioning a damper in a portion of the nitrogen gas flow.

In some embodiments, establishing a shear force profile in the chamber may include establishing a heat distribution profile in the BNNT growth zone that produces aligned BNNTs emerging from the growth zone.

In some embodiments, a heat distribution profile of heat provided to the boron feedstock may be established that forms a BNNT self-assembly flux distribution that generates a desired level of BNNT alignment.

In some embodiments, BNNT initial yarn may be formed downstream of the growth zone. BNNT initial yarn may be collected in some embodiments, such as by spooling the initial yarn as it emerges from a stretch zone.

In some embodiments, a coating may be applied to all or to a portion of the aligned BNNT fibers. In some embodiments, BNNT initial yarn may be twisted, braided, and/or woven.

Embodiments of an apparatus for producing aligned boron nitride nanotube (BNNT) fibers may include a chamber providing a boron feedstock mounting surface; a heat source for thermally exciting a boron feedstock on the mounting structure, wherein the heat source provides heat into the chamber; a nitrogen gas supply system configured to feed nitrogen gas to the chamber upstream of the mounting structure and in a direction generally aligned with a BNNT formation direction; and a growth zone region downstream of the mounting structure. In some embodiments, the heat source may be configured to establish a heat distribution profile to form a BNNT growth zone in the growth zone region. Some embodiments may include an interference zone region downstream of the grown zone region. In some embodiments, the interference zone region may have a reduced cross-sectional area, configured to increase the volumetric flow rate of nitrogen through the interference zone region. Some embodiments may include a stretch zone region downstream of the interference zone region where the cross-sectional area may be adjusted to assisting the stretching of the BNNT initial yarn.

In some embodiments, the heat source may be configured to thermally excite a portion of the boron feedstock to form a BNNT self-assembly flux distribution that generates a desired level of BNNT alignment. Some embodiments may include a fan upstream of the mounting structure and configured to control the velocity distribution of the nitrogen gas in a plane perpendicular to the flow of the nitrogen gas.

DESCRIPTION

Figure 1A:
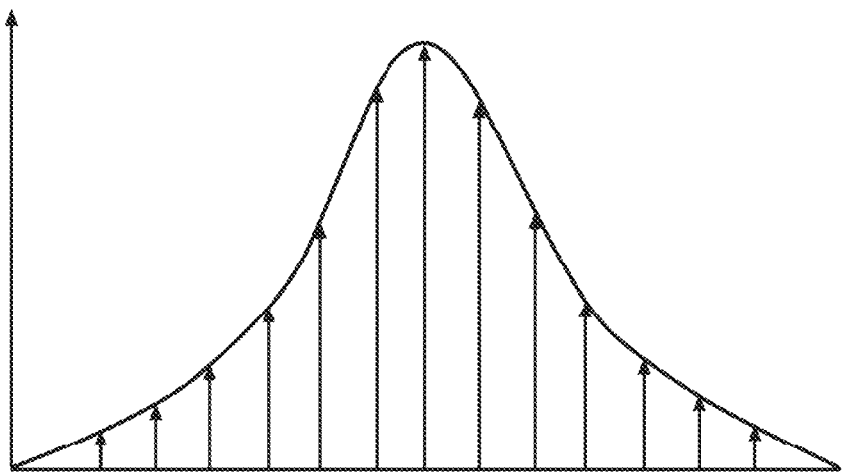
FIGS. 1A and 1B show example pressurized nitrogen gas distribution and BNNT self-assembly flux distribution profiles.

The following description is of the best currently contemplated mode of carrying out exemplary embodiments of the present approach. The description is not to be taken in a limiting sense, and is made merely for the purpose of illustrating the general principles of the invention.

Described herein are processes and apparatus for producing continuous fibers and strands of BNNT, and in particular BNNT fibers and BNNT strands having good fiber alignment, as well as BNNT yarns. Generally, BNNTs may be formed in a self-assembly region under nitrogen gas. BNNT fiber shear alignment may be enhanced by making adjustments to the velocity distribution of the nitrogen gas, and/or by making adjustments to the BNNT self-assembly region flux distribution, as discussed below.

The formation of BNNTs is fundamentally different than the formation of CNTs. Synthesis of CNTs typically requires a chemical catalyst, such as a metal catalyst. Unlike the production of CNTs, embodiments for producing BNNT fibers may be catalyst-free. Although gaseous diatomic nitrogen is difficult to crack, it can readily dissolve into molten metals and silicates to form compounds such as silicon nitride. Because of the enhanced synthesis at elevated pressures, the inventors hypothesize that the elevated pressure significantly increases the supersaturation of dissolved nitrogen into boron micro-droplets that form over the thermally excited boron feedstock. The inventors hypothesize that the elevated pressure increases nitrogen dissolution in boron micro-droplets, which in turn causes supersaturation of boron nitride. BNNTs vigorously self-assemble from boron nitride, and possibly other precursors, in a region in close proximity to the boron micro-droplets.

Thus, BNNT synthesis at elevated pressures proceeds without a catalyst. CNTs, on the other hand, typically require a metal catalyst. For example, as evident in chemical vapor deposition of methane gas over iron droplets (among other processes), CNT synthesis requires supersaturating dissolved carbon on a catalytic metal droplet or cluster. As a result, the metal catalyst must be removed through a subsequent purification step. Catalyst-free BNNT synthesis, on the other hand, does not require a similar purification step. In fact, because the reactants are only boron from the feedstock and nitrogen gas, in some embodiments the boron may be nearly completely consumed during synthesis.

Generally, BNNT fibers may be generated by thermally exciting a boron feedstock in the presence of nitrogen gas at an elevated pressure. It has been determined that feeding nitrogen gas at an elevated pressure drives the synthesis of BNNTs and results in higher production rates and improved BNNT quality and yield. In some embodiments, the boron and nitrogen reactants are maintained at an elevated pressure, such as an elevated pressure of at least 2 atmospheres to about 250 atmospheres, or, for example, an elevated pressure of at least 2 atmospheres to about 12 atmospheres. Boron-containing feedstock may include, as examples, elemental boron, elemental boron powder, boron nitride, boron nitride powder, cubic boron nitride powder, and hexagonal boron nitride powder.

Thermal sources such as laser heating and plasma heating have been shown to produce BNNT. For example, as described above, U.S. Pat. No. 8,206,674 to Smith et al., the contents of which are incorporated by reference in their entirety, describes a process for preparing large quantities of BNNTs through laser heating at elevated pressures (e.g., about 2 atm to about 250 atm). In the process disclosed in this patent, boron vapor is created through thermally exciting a boron source and nitrogen gas near the boron source with a laser or other heat source; mixing the boron vapor with nitrogen gas at an elevated pressure, and harvesting boron nitride nanotubes formed at a nucleation site. The process disclosed in that patent resulted in the formation of BNNTs around nucleation site including the surface of the boron feedstock. The short BNNT "streamers" were limited to around 1 cm in length, and difficult to harvest from the region of the nucleation site without losing alignment. Unlike that patent, embodiments of the present method may be configured to produce and extract continuous BNNT fibers, BNNT strands and BNNT initial yarns, including fibers, strands, and initial yarns of substantial length.

U.S. Pat. No. 8,753,578 to Smith et al. discloses a laser-driven process for producing BNNTs. This patent teaches thermally exciting an end of a boron-containing rod in a chamber with nitrogen gas at an elevated pressure, forming BNNTs along a cooled condenser positioned in close proximity to the end of the boron-containing rod. The cooled condenser rotates over a collection tube that removes BNNT from the condenser through a vacuum. Under this method, the BNNTs form on the condenser in one direction, and are extracted in another direction. Thus, BNNT "streamer's" lengths may be limited by many features of the described process, including condenser rotation speed, along with self-assembly limitations from temperature gradients. Also, the extraction hinders achieving good BNNT fiber, strand and initial yarn alignment.

Other means of thermal excitation may be used. For example, U.S. patent application Ser. No. 14/529,485 to Smith et al., the contents of which are incorporated by reference in their entirety, describes a process for preparing large quantities of BNNTs through inductively-coupled plasma (ICP).

Prior apparatus and methods for producing BNNTs relied on condensers in close proximity to the boron feedstock to induce nanotube formation. In embodiments of the present approach, BNNTs are encouraged to self-assemble into BNNT fibers in space near the boron feedstock, through various combinations of nitrogen gas flow direction and velocities, heat distributions, temperature gradients, and chamber geometries. One or more BNNT strands may form when multiple lengths of BNNT fibers commonly align and/or aggregate and have some interconnection between fibers. The term BNNT initial yarn, as used herein, refers to BNNT fibers and BNNT strands that form both in and downstream of BNNT formation in the self-assembly region. BNNT initial yarn may include various admixtures of particles of boron, BN (boron nitride), and h-BN (hexagonal-BN), depending on the production method.

Figure 1B:
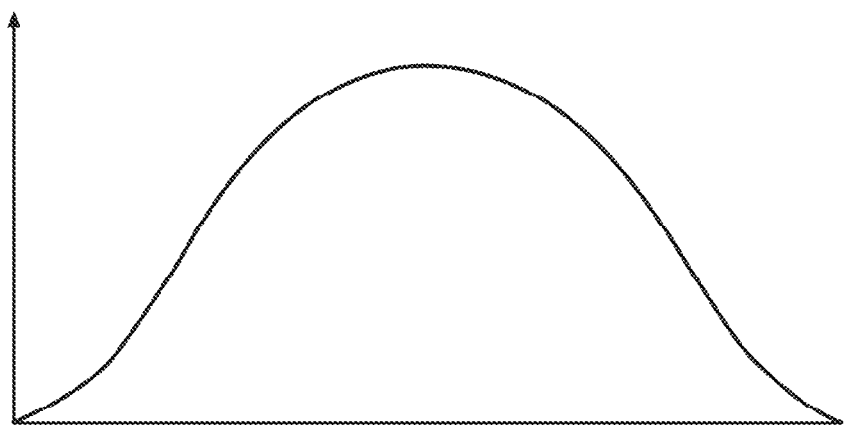

Generally, under the present approach, a boron melt is generated by heating a boron feedstock and adjacent nitrogen gas in a high pressure nitrogen environment. Embodiments of the present approach may be performed in an apparatus having a chamber, through which nitrogen gas at elevated pressures may flow. The high pressure nitrogen gas flowing across the boron melt may have a flow velocity distribution (generally referenced as Vcoflow). FIG. 1 shows a demonstrative general nitrogen gas flow velocity distribution, for a boron melt positioned in the center of the horizontal axis. The nitrogen gas flow velocity distribution will depend on several factors, including for example, chamber geometry and any physical obstructions, nitrogen compression and injection rate, and the convection buoyancy effect from the heat source. Vcoflow may be generated and controlled by various methods. For example, in embodiments, Vcoflow may be controlled by one or more of a pressure difference created by a flow fan, the injection rate of compressed nitrogen gas, the initial pressure of the compressed nitrogen gas, and heat driven convection or buoyancy, applied across a flow control structures including baffles.

Some embodiments may include a flow fan, such as a flow fan upstream of the boron feedstock. A flow fan can be utilized to vary the velocity of the nitrogen gas flowing to the boron melt. The fan creates a pressure difference by raising the pressure of the nitrogen gas.

Nitrogen gas injection rate and initial pressure may be used to adjust Vcoflow. For example, nitrogen gas can be injected into the flow to vary the velocity of the nitrogen gas, vary the velocity distribution of the nitrogen gas, vary the pressure of the nitrogen gas, and vary the magnitude of Vcoflow. One of ordinary skill should appreciate that one or more parameters may be adjusted to modify Vcoflow, and may establish a Vcoflow for an apparatus that generates the desired alignment in the generated BNNT fibers and strands.

One of ordinary skill should also appreciate that amount and distribution of heat may vary parameters that impact the alignment in BNNT fibers and strands. For example, the amount of heat and the distribution of heat applied to the boron melt, and also the nitrogen gas in the region of the boron melt, can be utilized to vary the nitrogen gas convection forces, such as buoyancy. In turn, nitrogen gas convection forces may be used to vary the velocity and velocity distribution of the nitrogen gas Vcoflow.

FIG. 1 also shows a general BNNT self-assembly region flux distribution. The boron melt can have varying temperatures in different regions of the melt. The rate of boron vaporization, the rate of nitrogen gas dissolving into the boron and the rate of boron vapor and precursor material feeding the BNNT self-assembly process depends on the details of the boron melt temperature and nitrogen gas Vcoflow. By varying the distribution of the heat going into the boron melt, the flux distribution of material feeding the BNNT self-assembly process can be varied. One of ordinary skill should appreciate that these parameters may be optimized for an apparatus, to produce BNNT fibers, BNNT strands, and BNNT initial yarns having a desired alignment. Apparatus may vary significantly, and therefore parameters for one apparatus may not generate the same results in a separate apparatus.

In embodiments of the present approach, there are generally three primary zones in the BNNT fiber, strand and initial yarn formation. As will be described herein, shearing forces and conditions may be used in each zone to align BNNT structures. Zones may overlap to varying degrees in different embodiments, i.e. there are no sharp boundaries between zones, and one zone may penetrate deep into a subsequent zone. Zone 1 is the "growth zone," and is generally the self-assembly region for initial BNNT structures. In the growth zone, BNNT molecules referred to as BNNT fibers grow from the isolated micro droplets and the boron melt and from the boron melt itself. For example, heating a boron feedstock in a high pressure nitrogen environment causes micro-droplets to condense above the boron melt in what this disclosure refers to as the "growth zone" of the self-assembly region. At sufficiently high temperature, such as a temperature that causes boron droplets to form, as would be known in the art, BNNTs and BNNT fibers form from the micro-droplets in the growth zone.

Figure 2A:
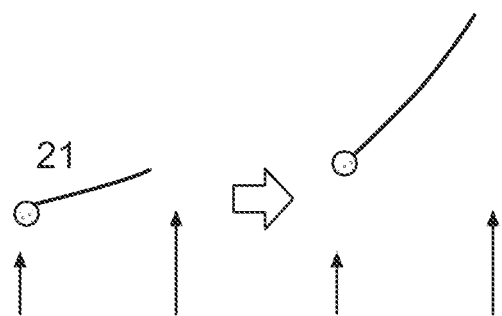
FIGS. 2A-2C show BNNT alignment enhancements in different zones.

In embodiments of the present approach, BNNT fibers may acquire preferred alignment in the growth zone. FIG. 2(A) shows BNNT fiber 21 in a growth zone changing alignment due to the nitrogen gas, Vcoflow, flow. The alignment is generally a result of the nitrogen gas differential velocity distribution across the self-assembling BNNT fibers and is influenced by the flux density of the self-assembling BNNT fibers. If the velocity distribution were flat, there would likely be no preferred alignment direction for the BNNT fibers. If the nitrogen gas velocity distribution were turbulent, the alignment would be localized with characteristics of the length scales of the turbulent flows. One of ordinary skill should appreciate that the Vcoflow nitrogen gas differential velocity generating the ideal alignment will vary between apparatus, and therefore various nitrogen gas differential velocities should be evaluated for the impact on alignment in the growth zone.

Figure 2B:
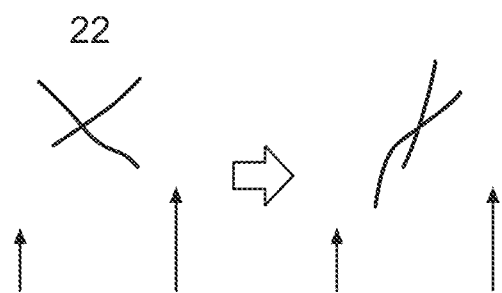

Zone 2 is the "interference zone" in which BNNTs become long enough to interfere with each other and form BNNT strands. In the interference zone, BNNT fibers may cohere by intermolecular forces, creating a loose, but generally interconnected cloud or moving stream of cotton-like BNNT structures. In most embodiments, a cotton-like state of BNNT first occurs in this interference zone as the BNNT strands assemble. FIG. 2(B) shows an enhancement in the alignment of BNNT strands 22 in an interference zone due the velocity distribution of the Vcoflow nitrogen gas. The alignment is self-reinforcing, e.g., the forces between BNNT fibers are greater if they are close to each other over their lengths, i.e. aligned, and they tend to enhance the alignment set up by the shear forces from the velocity distribution and intern this brings the BNNT strands closer together.

Under the present approach, BNNT strands may acquire preferred alignment and/or further alignment enhancement in the interference zone. In the interference zone, the nitrogen gas differential velocity distribution across the interacting BNNT strands may align some BNNT strands that did not achieve the desired alignment in the growth zone, and also enhance the alignment of BNNT strands forming the cotton-like cloud of BNNTs. If the nitrogen gas velocity distribution were flat in this region there would be clumping of the BNNTs but alignment would only be present if there were alignment already present from Zone 1. If the nitrogen gas velocity distribution were turbulent, the alignment would be localized with characteristics of the length scales of the turbulent flows. One of ordinary skill should appreciate that the nitrogen gas differential velocity generating the ideal alignment will vary between apparatus, and therefore various nitrogen gas differential velocities should be evaluated for the impact on alignment in the interference zone.

Figure 2C:
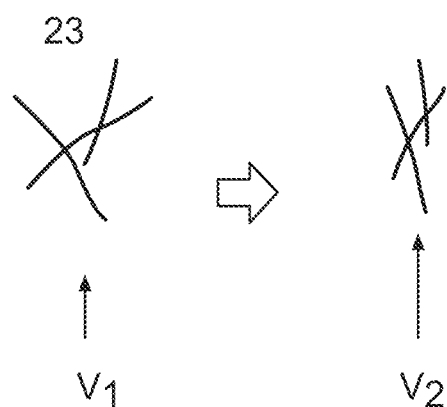

Zone 3 is the "stretch zone" in which BNNT strand structures stretch in length and decreases in diameter. FIG. 2(C) shows BNNT structures 23, which comprise BNNT initial yarns (and possibly BNNT fibers, BNNT strands and other species), improving alignment due to the overall initial yarn diameter decreasing in the stretch zone, among other shearing forces present in the zone. In the stretch zone, the straining force is generally resisted by aerodynamic drag and, in some embodiments, gravity. In some embodiments, BNNT structures entering the stretch zone will include BNNT initial yarns. In some embodiments, BNNT fibers and BNNT strands may begin to form BNNT initial yarns in the stretch zone. It should be appreciated that the primary zones may overlap by varying degrees in different embodiments. For example, in one embodiment there may be a discernable transition between zones, whereas in another embodiment there may be a gradual transition between zones.

Under the present approach, the stretch zone may include a BNNT collection device such as a take-up real or spool. The take-up reel or spool may be used to pull on the cotton-like BNNT stream of BNNT fibers and BNNT strands to create longitudinal strain and resulting shear alignment in the stretch zone. The amount of shear can be controlled to some extent by the difference in velocity between V1 and V2, where V1 is the natural velocity due to convection buoyancy and Vcoflow, and V2 is the physical velocity induced by the take-up reel or spool. The velocity difference for alignment is dependent on the particular apparatus used. One of ordinary skill should appreciate that these parameters may be varied for a particular apparatus to achieve the desired alignment.

Under the present approach, the combination of the velocity distribution shear forces in Zone 1 and Zone 2, as well as any structural changes in the BNNT structures in Zone 3 (generally, the structures will include BNNT fibers, BNNT strands and BNNT initial yarn) as the initial yarn is stretched and reduced in diameter, combine to create the overall BNNT alignment as seen in the BNNT initial yarn wound on the take up reel/spool.

Generally, an apparatus for producing continuous BNNT fibers may include a chamber, a boron feedstock holder, a pressurized source of nitrogen gas, a nitrogen gas injection mechanism, a flow fan, a heat source, apparatus regions containing the growth zone, interference zone, and stretch zone, and a collection region. Some embodiments may include a flow control lining. A flow control lining may be structure that provides a cross section area and shape for the nitrogen gas flow into the chamber, or through a region of the chamber, to affect the nitrogen gas velocity distribution For example, embodiments may include a flow control lining upstream of the boron feedstock, but downstream of the nitrogen gas injection point(s) for the chamber. The nitrogen gas flow elements and boron feedstock holder may be configured for thermal excitation from the heat source, and for exposure to high pressure nitrogen gas flow. In some embodiments of the present approach, boron-containing feedstock may positioned in a chamber in which thermal excitement of the boron-containing feedstock may be provided in a first direction, and the pressurized nitrogen gas may be provided in a second direction. In some embodiments, the first direction and the second direction may be generally parallel. In some embodiments, the first direction and the second direction may be generally perpendicular. One of ordinary skill should appreciate that other relative directions may be employed as desired, and typically will depend on the geometry of a particular apparatus, the type and mounting of feedstock, and the desired collection method.

Figure 3:
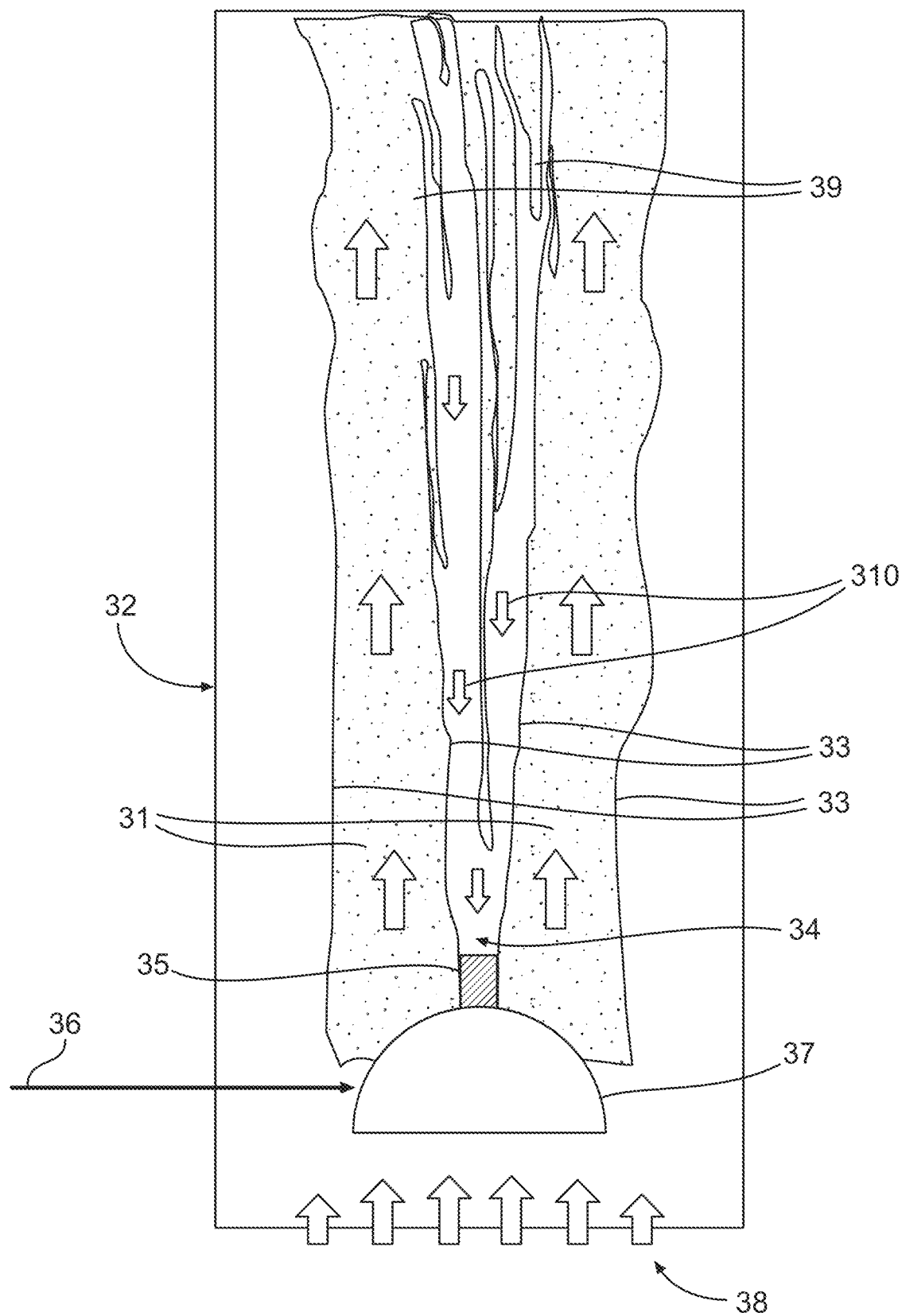
FIG. 3 is a drawing of an early prototype apparatus for producing continuous BNNT fibers.

FIG. 3 is a drawing of an early prototype apparatus for producing continuous BNNT fibers, BNNT strands and BNNT initial yarns. The apparatus in FIG. 3 includes a chamber 32 in which boron feedstock 37 is positioned on a holder. Boron feedstock 37 is thermally excited from a heat source 36, which in this prototype is a laser, at a temperature sufficient to create a boron melt as described above. Pressurized nitrogen gas 38 flows across the boron melt 37. In the prototype apparatus, the pressurized nitrogen gas flow 38 is in a direction that is generally perpendicular to the direction of the heat 36 supplied to the chamber. It should be understood that the relative orientations of the heat and nitrogen gas may vary in different embodiments.

In FIG. 3, BNNT precursors 31 form as boron micro-droplets condense above the surface of the boron melt 37, and as pressurized nitrogen gas 38 begins to dissolve in the boron micro-droplets. In this particular embodiment, BNNT precursors 31 are continuously produced and flow from bottom to top (as shown in the drawing, and with the understanding that the actual direction depends on the apparatus' orientation), and BNNT initial yarn 310 is continuously produced and flows top to bottom. As they travel upward, BNNT precursors form BNNT fibers, also 31. BNNT strands 39 form along the way to the top of the figure, and the BNNT initial yarn forms as the BNNT strands come together and are pulled and stretched downwards towards the boron melt. By focusing the heat source 36 on roughly the center of mass of the boron melt 37, the heat source 36 in this particular embodiment induced the counter-flow of BNNT initial yarn 310 as shown in FIG. 3. It should be appreciated that the relative material flows may be altered by varying the distribution of the heat source 36 on different regions of the boron melt 37. In experiments performed using a prototype of this embodiment, the maximum velocity of the BNNT precursors 1 was about 1 m/s, and the velocity of the drawn BNNT fiber 310 was about 0.25 m/s. The BNNT initial yarn as described below, may be anchored to a liquid or solid draw bar 35. The shearing action at the interfaces 33 and their associated nitrogen gas velocity distributions 38, as described above, induces alignment in the growing BNNT initial yarn 310.

In the embodiment shown in FIG. 3, the growth zone (Zone 1) 31 feeds into the interference zone (Zone 2) 39, where in this embodiment the BNNT initial yarn begins to form and is looping back, and then feeds into stretch zone (Zone 3) 310 feeding the initial yarn to the liquid draw 35.

Aligned counter-flowing BNNT initial yarn produced in the prototype embodiment shown in FIG. 3 was extracted during experimental runs by: 1) manipulating the BNNT flux distribution via manipulating the input heat distribution going into the boron melt, 2) manipulating the heat distribution going into the adjacent nitrogen gas, and 3) manipulating the pressurized nitrogen gas velocity distribution. The heat going into the boron melt was adjusted to enhance the BNNT flux above the center of the boron melt and heat going into the convection buoyancy was redistributed to make the nitrogen gas flow more laminar. These variables were adjusted manually until an acceptable/desired alignment of the BNNT initial yarn was achieved.

Figure 4:
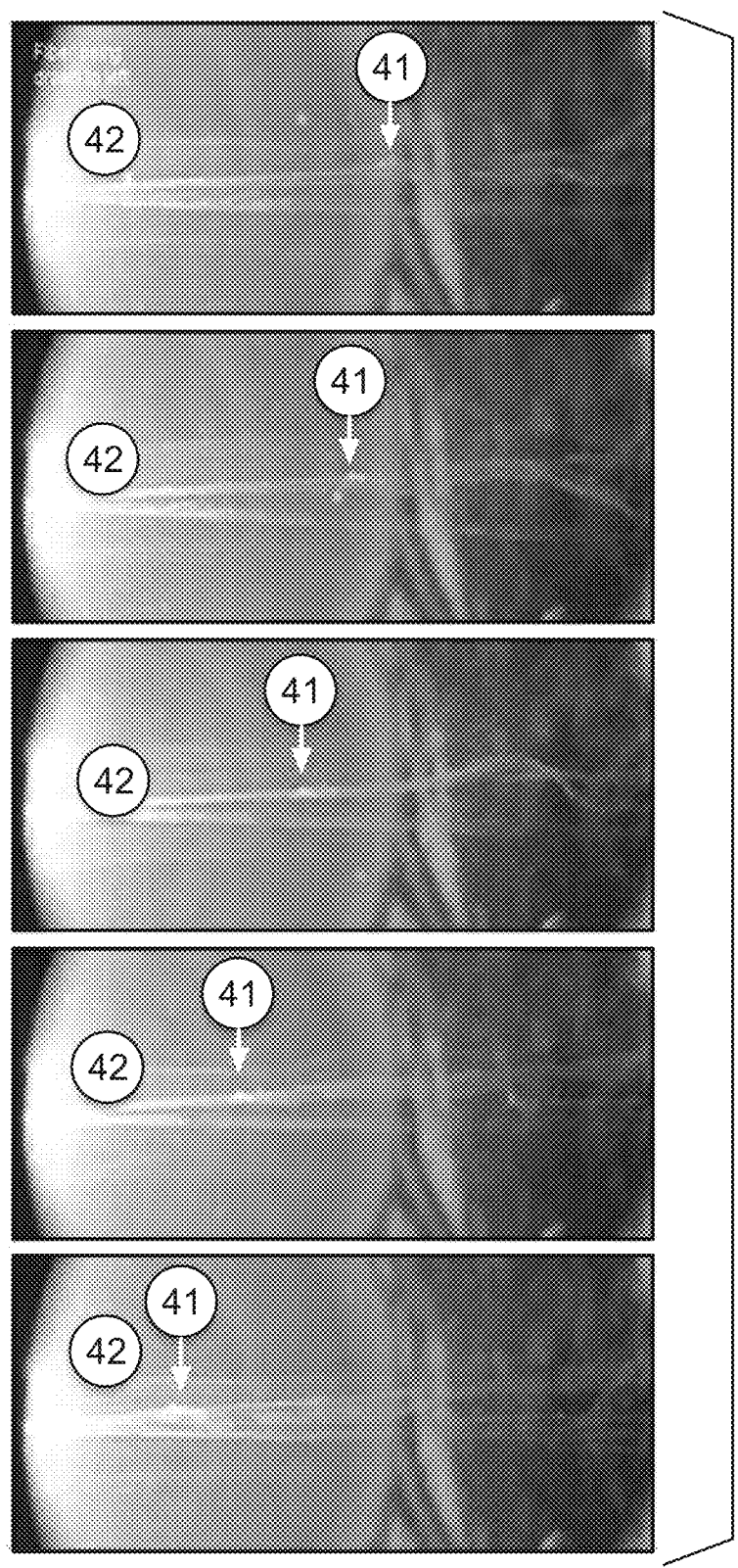
FIG. 4 shows a series of five still images extracted from experimental video data using a prototype apparatus as described with respect to FIG. 1.

FIG. 4 shows a series of five still images extracted from experimental video data using a prototype apparatus as described with respect to FIG. 3. The BNNT initial yarn 42, as indicated by the label in the top image, leaves the video frame to the left of the image. A series of vertical arrows on the image sequence denote a particle 41 that has been entrained in the growing BNNT initial yarn 42. The particle 41 serves as a convenient reference to indicate the motion and velocity of the fiber 42. The width of each image represents about a 1.25 inch field-of-view. The images are spaced approximately 50 msec apart in time (total elapsed time for the sequence is 200 ms).

Figure 5:
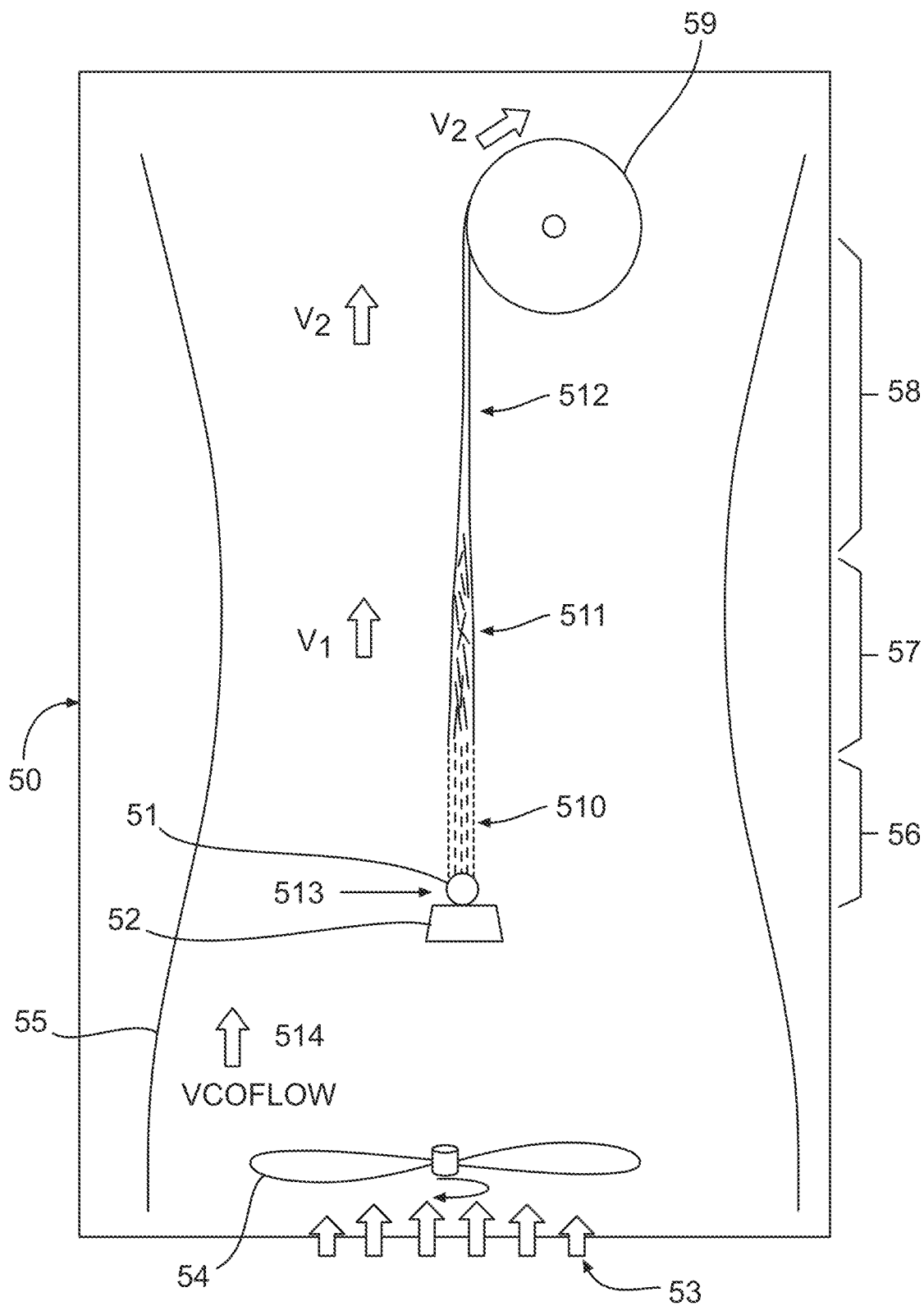
FIG. 5 is a diagram of an embodiment of an apparatus for forming continuous BNNT fibers, strands and initial yarns.

The prototype apparatus shown in FIG. 5 is one example of an apparatus for producing continuous BNNT fibers, strands and initial yarns. It should be appreciated that numerous other embodiments may be made without departing from the principles described here. For example, the heat source 513 may be focused on upper regions of the boron melt 51 to induce continuous material flow in the same direction as the nitrogen gas flow, Vcoflow 514.

FIG. 5 is a diagram of an embodiment of an apparatus 50 in which continuous BNNT fibers, strands and initial yarns 510, 511, and 512 form without a counter-flow. In apparatus 50, a boron melt 51 is formed by heating 513 a boron feedstock on a target holder 52. Pressurized nitrogen 53 is supplied to the chamber from nitrogen chamber 50 from below. Some embodiments may include control fan 54 for controlling pressure changes and convection buoyancy inside apparatus 50. For instance, control fan 54 may also expand the temperature gradient above boron melt 51 to further enhance BNNT formation. BNNT fibers 510 self-assemble above the boron melt 51, and due to the nitrogen gas flow, convection buoyancy, and flow control cowling 55, self-assemble in the growth zone 56. The distribution of heat 513 on the boron melt and into the adjacent nitrogen gas 51, as discussed above, controls the distribution of BNNT flux above the boron melt 51. It should be noted that the growth zone 56 is generally identified for simplicity; it could extend from just above the boron melt 51, and overlap with interference zone 57. FIG. 5 includes arrows 53 to show the general pressurized nitrogen gas velocity distribution profile. It should be observed that various chamber geometries, such as cowling 55, may be used to control and modify the nitrogen gas velocity profile, Vcoflow, 514 along the length of other embodiments. For instance, the apparatus profile at a particular zone may be reduced to intensify shearing along that region, and enhance alignment. However, one or ordinary skill should appreciate that over-shear can be undesirable as can be under-shear, and thus it may be necessary to experimentally establish the shearing and nitrogen gas profiles producing the desired alignment for an apparatus.

As BNNT fibers 510 enter the interference zone 57 (also generally identified), BNNT fibers interact with each other, coming in contact, and forming BNNT strands and initiating BNNT initial yarns 511 moving at velocity V1. BNNT initial yarns 512 proceed into stretch zone 58, in which aligned BNNT fibers, BNNT strands and initial yarns 512 stretch due to the difference between the velocity V2 of take-up reel or spool 59. The apparatus in FIG. 5 shows various features and configurations that may be incorporated into an apparatus for producing continuous BNNT fibers, strands and initial yarns. It should be appreciated that other embodiments may be made without departing from the principles described herein.

Embodiments of the present approach may be used to form BNNT yarns. Generally, BNNT yarns may be formed by twisting and spooling BNNT initial yarns, which are generally made of BNNT strands and BNNT fibers. The BNNT initial yarn may be collected on a rotating spool 59 inside a chamber at a region downstream of BNNT formation. BNNT formation may be through a number of processes. As discussed above, high-temperature, high-pressure processes allows BNNT fibers and BNNT strands to self-assemble downstream of the boron feed source. The BNNT fibers and BNNT strands may continue to flow downstream of the self-assembly region, toward a collection region.

In some embodiments, a take-up reel or spool 59 may be used in the collection region to spool the BNNT initial yarn. The process may be continuous until a spool has reached its capacity to collect BNNT initial yarn, at which time the spool is replaced with a new spool. Also, the spooled BNNT initial yarn may be re-spooled onto a new spool to form BNNT yarn, and may be twisted during re-spooling to enhance various physical properties, and may be re-spooled with one or more additional BNNT initial yarns to form larger BNNT yarns. The BNNT initial yarn may be composited with materials at any time starting from when the BNNT initial yarn forms, to when it is spooled, to when it is spun into BNNT yarn, to when it is unwound and combined with compositing materials.

Apparatus for forming BNNT initial yarns may feature a chamber having multiple regions that define a material path. Depending on the method used for forming BNNT fibers, the chamber may be configured to operate at enhanced pressures (e.g., up to 250 atm). The material path may be such that nitrogen gas is re-circulated. The initial region may be for forming BNNTs, and may include a boron feed source such as a boron ball, and a nitrogen gas supply. The chamber may include a region downstream of the initial region for BNNT fiber self-assembly. The apparatus may include a distribution of heat sources to lengthen the self-assembly region and enhance the conversion of boron particles to BNNTs. The chamber may include a region downstream of the self-assembly region for BNNT fibers to align and come into contact or bind, forming BNNT strands and BNNT initial yarns. Such regions may have different geometries to encourage alignment, binding, and desired nitrogen gas and BNNT initial yarn speeds. The chamber may include a spooling region downstream of the binding region to collect BNNT initial yarns on a spool. The spool may be inside the apparatus, or may be external to the apparatus if a suitable pressure exchange system is available. The apparatus may include de-spooling and re-spooling features, to allow BNNT initial yarns to be twisted and combined to form BNNT yarns.

Figure 6:
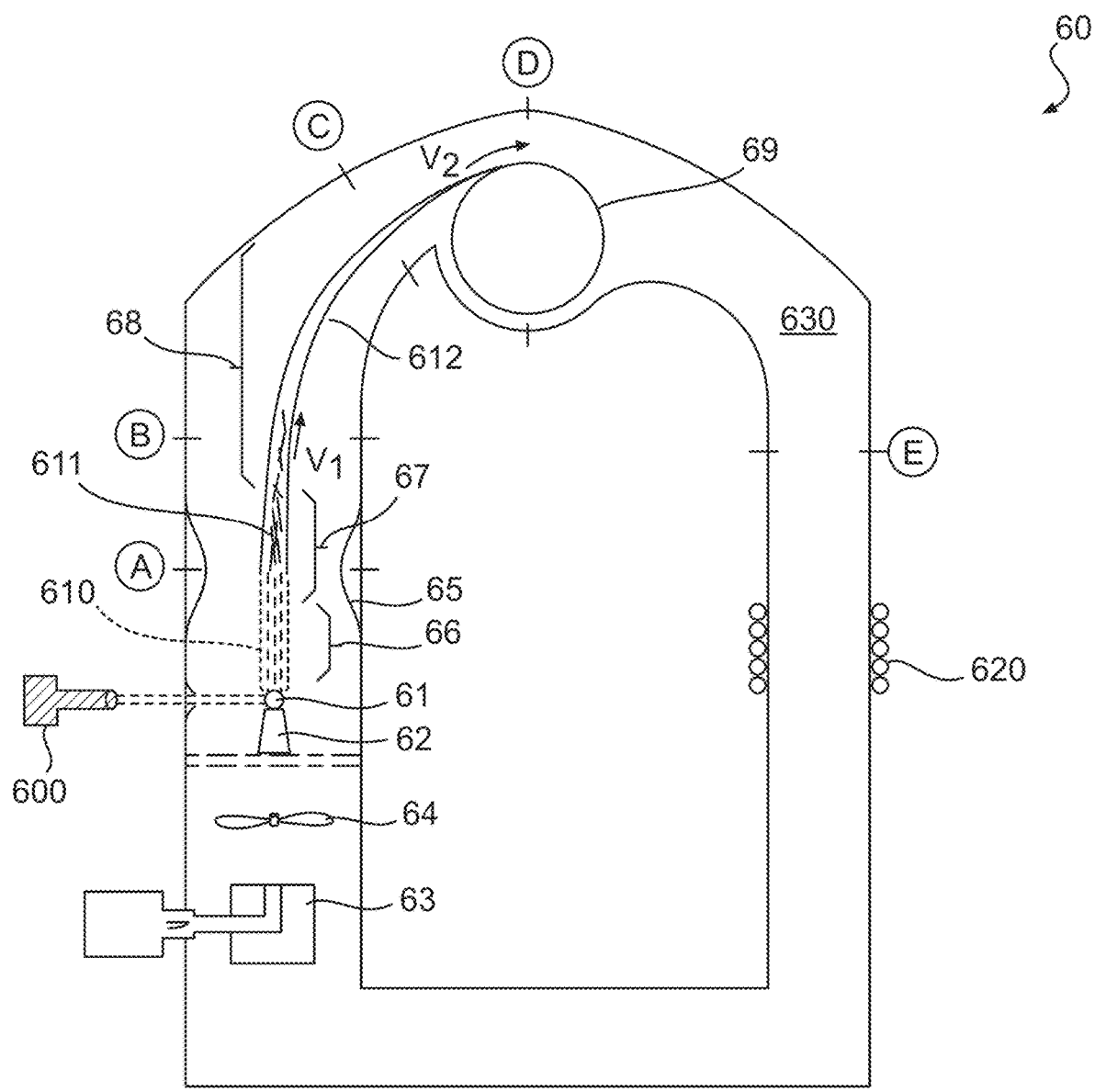
FIG. 6 is a diagram of another embodiment of an apparatus for forming continuous BNNT fibers, strands and initial yarns.
Figure 7A:
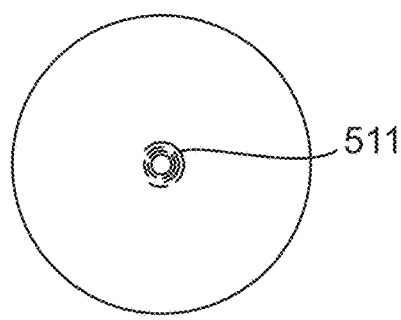
FIGS. 7A-7E illustrates several cross-sections of the apparatus in FIG. 6, taken in a plane perpendicular to the material flow direction.
Figure 7B:
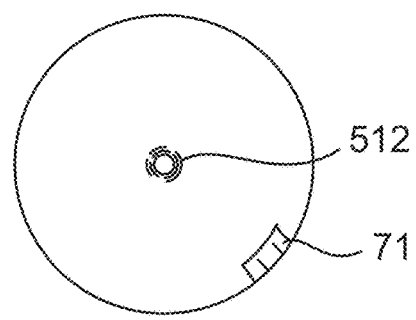
Figure 7C:
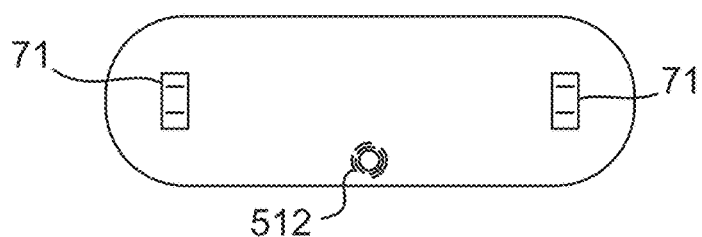
Figure 7D:
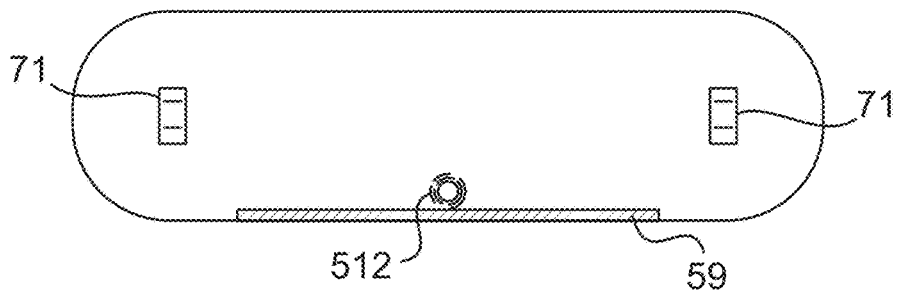
Figure 7E:
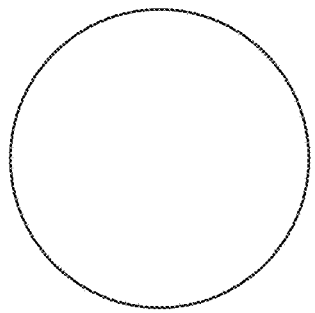
Figure 8A:
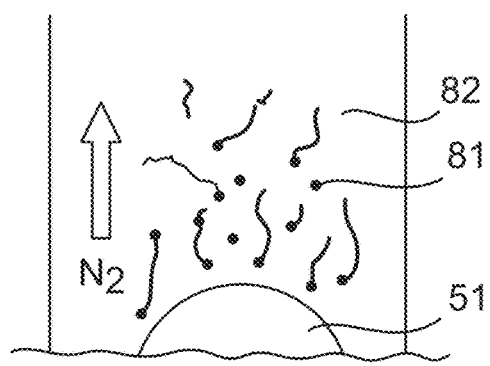
FIGS. 8A-8D illustrate the BNNT structures in several cross-sections of the apparatus in FIG. 7, taken in planes parallel and perpendicular to the material flow direction.
Figure 8B:
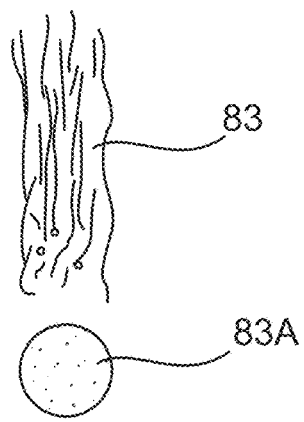
Figure 8C:
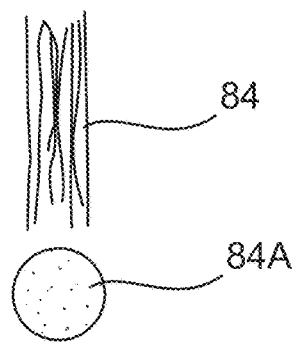
Figure 8D:
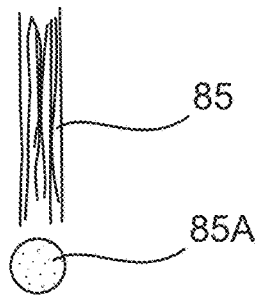

FIG. 6 is a diagram of an embodiment of an apparatus 60 for forming BNNT initial yarn 612 using a laser-driven, high-temperature, high-pressure process. It should be appreciated that alternative heat sources, including multiple lasers, may be used, as described above. The apparatus 60 includes a chamber 630 designed for operating at elevated pressures, that may in some embodiments go up to about 250 atm, and defining an interior volume with multiple regions. In some embodiments, the chamber may be operated at elevated pressures of at least 2 atmospheres to about 12 atmospheres. As described herein, the cross-section shape and area may vary at each region. In the laser-driven, high-temperature, high-pressure process, a laser beam heats a boron melt positioned on target holder 62 in the chamber to form a boron melt 61. The laser also heats the nitrogen gas adjacent to the boron melt. Boron vapor and BNNT precursors evaporate from the boron melt 61. A high pressure nitrogen gas flows from nitrogen source 63 and across the boron melt 61, providing a nitrogen source for BNNT formation. Some embodiments may include a flow fan 64, as described above. BNNTs 610 form in the growth zone 66, which in some embodiments may include the hot plume region of boron vapor, other BNNT precursors and hot nitrogen above the boron melt 61 surface.

BNNT fiber self-assembly occurs directly from the boron melt 61 and on boron droplets 66 or particles that condense from the boron vapor slightly above the boron melt 61 surface. Location A in FIG. 6 shows the approximate region in which BNNT structures 610, including BNNT fibers and BNNT strands 611, form in the laser driven high-temperature high-pressure process. Of course, additional steps may be required to form BNNT fibers and BNNT strands if another BNNT formation method is used.

The highly crystalline and catalyst-free BNNT fibers 611 produced in some embodiments of the present approach are typically 2-wall and frequently 3-wall structures, although fibers may include between 1 wall and up to about 10 walls. Typically, larger numbers of walls become less common as the number of walls increases. In this production method, the only process impurities are particles of boron and BN including amorphous BN and h-BN.

In general, the BNNT fibers can grow from the droplets in the vapor region in any direction; however there are two sources of preferential direction for BNNT fiber growth. First, BNNT fibers that grow directly on the boron melt tend to grow in the direction of the nitrogen and vapor flow. In FIG. 6, the nitrogen gas flows upward, past the boron feedstock 61, and through regions A, B, and so on. Apparatus 60 may include cowling 65 and other internal structures to modify nitrogen flow velocity profile distribution and vapor flow, to enhance alignment as described above. Second, BNNT fibers 611 that grow from the boron vapor droplets tend to be aligned with the nitrogen gas flow by a combination of shear alignment in the flow direction, and the fact that the location of the BNNT fiber growth on the droplets is free to move into alignment with the direction of flow due to the shear alignment.

The BNNT fibers 611 in the interference region 67 are fairly closely aligned in the nitrogen gas flow and can align with each other and enhance the attraction with each other. As a consequence, BNNT strands tend to form within the flow, and the final BNNT initial yarn 612 that forms is a combination of the BNNT strands and BNNT fibers that may be more randomly oriented relative to the BNNT strands. In some instances the boron droplets travel farther down the chamber, downstream of location A, before becoming super cooled and beginning to form BNNT fibers, BNNT strands, and BNNT initial yarns, in the stretch region 68.

In one embodiment of the apparatus, the BNNT fiber self-assembly region (including the BNNT initial yarn formation region) includes the chamber interior beginning with the boron melt (or other boron feedstock) to many centimeters above the boron ball. The precise region will depend on the geometry of the chamber, particularly near location A, nitrogen gas flow rates, and heat sources.

As discussed above, additional energy may be supplied to the BNNT nitrogen gas adjacent to the boron melt, the boron melt and the fiber self-assembly by a secondary heat source, such as one or more additional lasers, etc. The additional energy from a secondary heat source may extend the region of self-assembly of the BNNT fiber self-assembly. Extending the self-assembly region lengthens the BNNT fibers, and increases the number and/or size of BNNT strands formed, as more of the boron vapor and boron droplets are converted to BNNT fibers.

Due to the high temperatures and high pressures involved in the BNNT fiber self-assembly and concurrent/subsequent BNNT strand and BNNT initial yarn formation process, the BNNT yarn processes described herein are largely different from processes applicable to the formation of carbon nanotube yarns, and low quality BNNT formation processes where the BNNTs typically are shorter, have a large number of walls, multiple defects, and are usually not very fibril.

The following paragraphs describe the flow management downstream of the boron source in the apparatus shown in FIG. 6. In experiments conducted using a prototype apparatus, the vertical speed of the mixture of boron vapor, nitrogen gas, boron droplets, and BNNT initial yarn 612 typically ranged between 0.1 m/s to about 5 m/s, depending on conditions including the size of the boron melt, the amount of heat source, the nitrogen gas pressure, the distribution of heat going into the nitrogen gas convection buoyancy, and the geometry of the chamber immediately downstream of the boron ball and in the BNNT fiber self-assembly region. In some embodiments, the nitrogen gas flows in a chimney-like circulation pattern, or in a loop, and the flows may be mostly laminar. In some embodiments, back-streaming and local turbulent flows might occur. The cross section of the chamber regions may be designed such that nitrogen gas velocity maintains a local BNNT initial yarn speed at a speed that keeps a slight tension on the BNNT initial yarn after formation, i.e., at and downstream of the self-assembly region.

The overall nitrogen gas flow may controlled by one or more of: 1) the amount and distribution of heat introduced by the heat source, including any secondary heat source, 2) the location and amount of the cooling in various regions of the chamber, 3) the nitrogen pressure, and 4) the cross-sectional profiles of the different sections of the apparatus along the nitrogen gas loop, including local baffles. FIGS. 7A-7E illustrate demonstrative cross-section profiles (A)-(E) for the apparatus 60 shown in FIG. 6. The cross-sections shown in FIGS. 7A-7E are taken at planes perpendicular to the flow direction through the chamber. The example cross-sections in FIGS. 7A-7E are generally circular or ovular, but other embodiments may use different geometries to manage the nitrogen gas flow speed and keep a slight tension in the BNNT initial yarn at and downstream of the self-assembly region.

In the prototype embodiment shown in FIGS. 6 and 7A-7E, location A is generally circular and large enough to convey the hot vapors upstream from the boron source. However, it is generally preferable to avoid vapor speeds that create overly turbulent flows. In some embodiments, it may be preferable to manage the cross sections and volume to allow down draft currents within the chamber.

In the prototype embodiment, location B is similar to location A, but in other embodiments may be slightly smaller or larger to keep the slight tension in the BNNT initial yarn 612 as the drag from the viscosity of the BNNT fibers, BNNT strands, and BNNT initial yarn 611 changes as the temperature of the vapor lowers downstream of the self-assembly region.

In the prototype embodiment, locations C and D include a more open profile. The open profile allows the BNNT initial yarn 612 to maintain its speed downstream of the self-assembly region, and move nearer to the edge of the chamber interior in preparation for spooling prior to location E. The open profile allows the process to be demonstrated though with less locational control of the BNNT initial yarn going onto the spooler.

In the prototype embodiment, location E is a downdraft from the internal spooling operation, discussed below. In other embodiments, location E may be downstream of the pressure chamber exterior walls, such as when a more open geometry is utilized. After spooling the BNNT initial yarn, the chamber cross-section may be most anything, provided that cooling of the nitrogen gas takes place and nitrogen is cycled back to the beginning of the process, i.e., the region of the boron source, such as the boron melt used in the demonstrated embodiments, at the desired initial nitrogen gas speed.

One of ordinary skill should appreciate that the exact shapes and cross-sectional areas of sections B, C, D and E can be modified in real-time by dampers 71. A damper material, as commonly seen in a chimney, may be placed in the flow path of the nitrogen gas but not in the flow path of the BNNT initial fiber where the angle/cross section of the damper can be varied by changing its angle with respect to the direction of the nitrogen gas flow. For example, the cross-sections shown in FIGS. 7A-7E include various dampers at different locations (the dampers are omitted from FIG. 6 for simplicity). The dampers manage the flow of nitrogen gas and thereby assist in managing the speed/flow of the nitrogen gas in contact with the BNNT initial yarn.

The following paragraphs describe the formation and handling of BNNT strands and BNNT initial yarns. As the BNNT fibers form on and above the boron ball in the self-assembly region, such as the region near location A inside the chamber shown in FIG. 6, at least some of the BNNT fibers begin to commonly align and form BNNT strands. The BNNT strands in turn are largely aligned with the BNNT initial yarn. In experiments run using a prototype embodiment, the BNNT strands are about 1 micron to about 50 microns in diameter. Also, a BNNT initial yarn at any location downstream of the self-assembly region may have 1 BNNT strand to about 30 BNNT strands. More BNNT strands may be possible, depending on operating conditions and chamber design. In experiments run using a prototype embodiment, 2 BNNT strands to 20 BNNT strands represented the majority of the BNNT initial yarn produced.

The BNNT initial yarn diameter may change as the material moves farther downstream of the self-assembly region. In experiments run using a prototype embodiment, the BNNT initial yarns in and around location B are typically about 0.05 mm to 4.0 mm in diameter, and the BNNT initial yarns in and around location C are about 0.02 mm to 1.5 mm in diameter.

As the BNNT initial yarn moves through the process, the BNNT strands may bind closely together. This binding results in part from the slight tension kept on the BNNT initial yarn as discussed above, and also from the alignment attractive forces, i.e. some alignment tends to produce forces that create more alignment due to the close proximity of multiple BNNT fibers with each other and their mutual attraction. As the BNNTs are electrically insulating while CNTs are electrically conductive or semi-conductors, these BNNT alignment attractive forces are typically much larger in BNNTs as compared with CNTs which is another example of how BNNT processes are significantly different from CNT processes.

Embodiments may include steps to prepare the BNNT initial yarn for spooling. For example, a step of changing the general cross-sectional shape of the BNNT initial yarn may improve spooling. In experiments run using a prototype embodiment, the shape of BNNT initial yarn at location D may be compressed into an ovular or flat profile, in preparation for spooling. In experiments run using a prototype embodiment, compressed BNNT initial yarns had a general thickness of micron 1 to about 100 microns, and a width of about 2 microns to about 300 microns. The BNNT strands at location D are preserved in the structure and do become closer to each other. These ranges of values are dependent on the details of the embodiment and values outside of these ranges can be anticipated in other embodiments.

As another example, changing the direction of the BNNT initial yarn may assist in spooling the initial yarn. For instance, as shown in FIG. 6, the angle of the BNNT initial yarn 612 at location D, relative to the flow direction from the self-assembly region, may be about 60 degrees. In the prototype embodiment, the angular change assisted the spooling process. The angle in other embodiments may vary from 0 to 360 degrees, depending on the chamber interior geometries used for the process. Additionally, a longer initial yarn path to location D may be utilized to enhance the viscous drag on the BNNT initial yarn, and thereby enhance stretching and BNNT fiber-to-fiber and strand-to-strand connections as the material is wound onto the spool.

As described above, the BNNT initial yarn in some embodiments may include less aligned components and randomly aligned components. The less aligned or randomly aligned components of the BNNT initial yarn may provide separation of the BNNT strands.

FIG. 8 shows cross-sections of portions of the regions labeled A-D in FIG. 6, the cross-sections taken in planes perpendicular and parallel to the material flow direction through the apparatus. Location A is generally the self-assembly region in which the BNNT fibers 82 grow from micro-droplets 81 and BNNT strands form. Locations B and C are BNNT initial yarn 83 transport regions, in which the BNNT initial yarn 83 becomes slightly more compact transversely 83a, and is steered toward the spool. Location D is the spooling region. The BNNT initial yarn 85 in FIG. 8 is shown being tangential to the spool, but the initial yarn may also encounter the spool at any angle up to and including being normal to the spool as discussed above. The cross-sections in FIG. 8 relate to the prototype embodiment, and other embodiments may use alternative cross-sectional shapes and geometries.

Figure 9A:
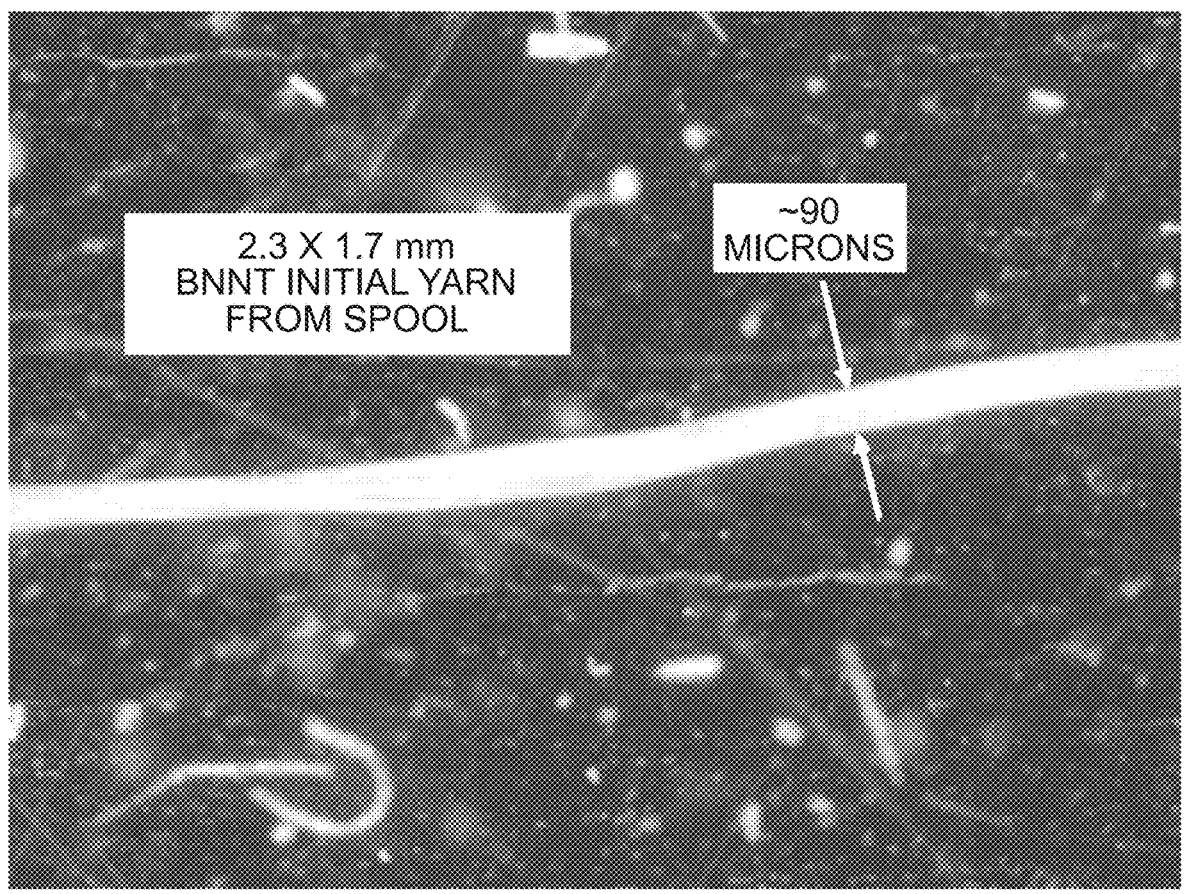
FIGS. 9A, 9B, and 9C are 2.3×1.7 mm images of BNNTs produced by embodiments of the apparatus and methods described herein.
Figure 9B:
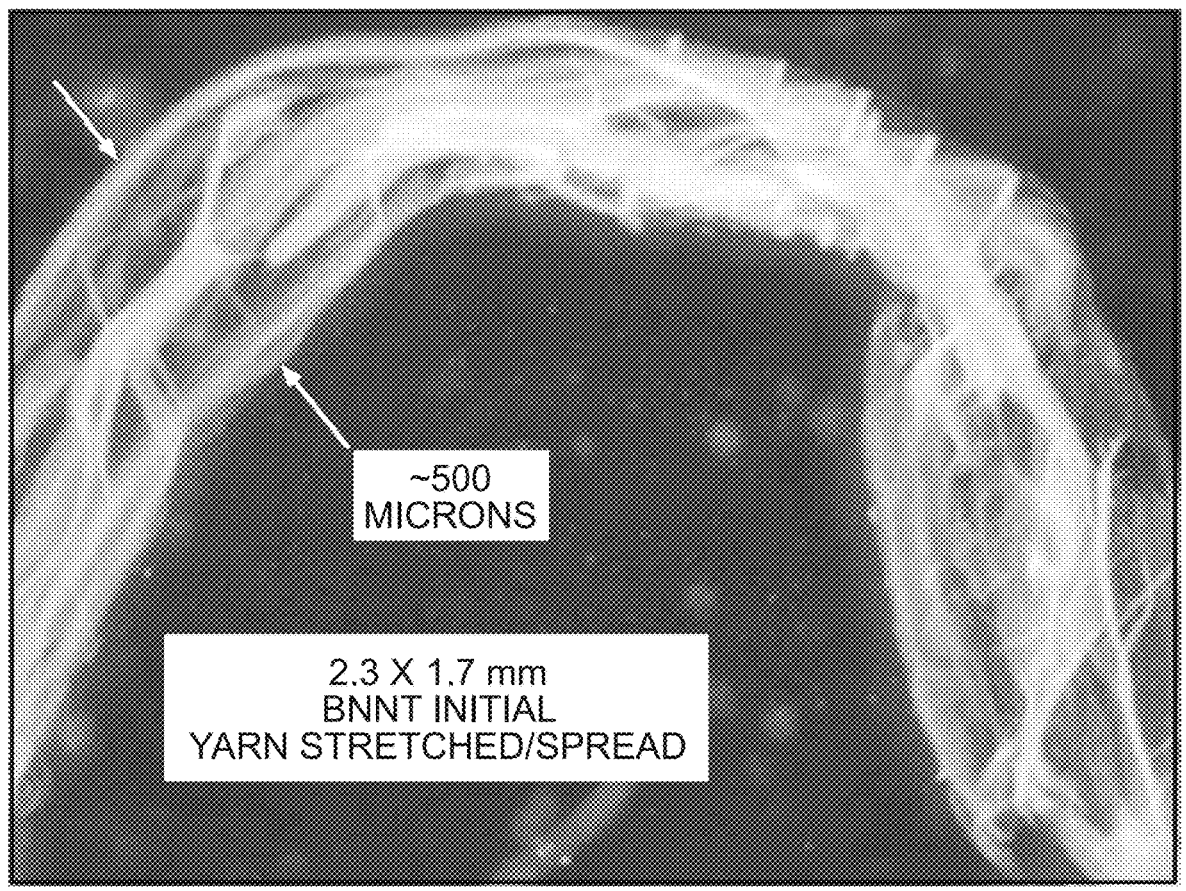
Figure 9C:

FIGS. 9A, 9B, and 9C show images of sections of BNNT initial yarns produced during experimental runs using a prototype embodiment apparatus. The images are for an area of 2.3×1.7 mm. The BNNT initial yarns extend beyond the image field. The structures visible in the images range from about 1 micron to about 2,000 microns, and are the BNNT strand and BNNT initial yarn structures, as opposed to BNNT fibers that are too small to be seen on the magnifications used for these figures.

FIG. 9A shows a section of BNNT initial yarn with a slight indication of the internal strand structure visible near the middle of the image. The BNNT initial yarn width is about 90 microns, which is slightly smaller than the BNNT initial yarn collected on the spool. The width change is a result of the slight stretching in extracting the BNNT initial yarn from the spool to position the BNNT initial yarn under a microscope for magnification and photography. FIG. 9B shows a section of BNNT initial yarn that has been stretched and spread apart, making the internal strand structure visible. FIG. 9C shows multiple overlapping BNNT initial yarns. Portions of the internal strand structure are visible.

The following paragraphs discuss the process used to spool BNNT initial yarn in embodiments of the apparatus and methods described herein. In the embodiment shown in FIG. 10A, the BNNT initial yarn is spooled onto a spool at location D of FIG. 6. The spool may be rotated at an angular speed such that the speed of the BNNT initial yarn matches the tangential speed on the spool. The spool may be made of a metal such as steel, copper or aluminum. BNNT is an electrical insulator with dielectric properties, and therefore BNNT initial yarn is electrostatically attracted to a metal spool. The electrostatic attraction is useful for drawing the BNNT initial yarn to the spool, particularly with respect to the initial portion of a material after start-up.

The spool may be of sufficient diameter that the BNNT initial yarn stays in contact with the spool during winding. The first portion of BNNT initial yarn is electrically attracted to the spool, and subsequent portions of BNNT initial yarn are both electrically attracted to other BNNT initial yarn and held by slight tension as described elsewhere herein.

In embodiments, the cross section of the chamber interior at location C and location D of FIG. 6, with the BNNT initial yarn and nitrogen gas, may be designed or modified such that the BNNT initial yarn is kept under a very slight tension and the speed of the nitrogen gas matches onto the speed of the spool. The chamber itself may be sized and shaped to encourage this behavior, and dampers may be used as described above. For example, the cross-sectional geometries of locations C and D may be managed such that the material flows are laminar, and any local back drafts do not interfere with the movement of the BNNT initial yarn.

Figure 10A:
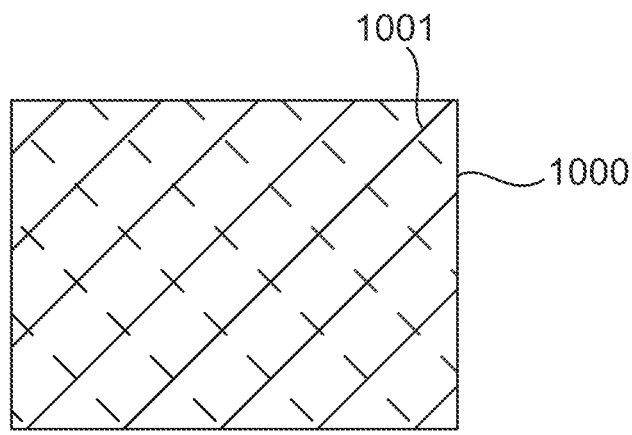
FIGS. 10A-10C illustrate the spooling of BNNT initial yarn according to embodiments described herein.

The BNNT initial yarn may be wound onto the spool as shown in FIG. 10A. In embodiments, the spool may be located at location D in the apparatus, inside the chamber and operating under the same operating pressure. Alternatively, a pressure differential system may be used that allows BNNT initial yarn to flow outside of the pressurized chamber, and toward a spool in an atmospheric environment. In addition to rotating, the spool may be moved back and forth along its axis (i.e., an axis perpendicular to the direction of the BNNT initial yarn approaching the spook). This oscillating movement assists with distributing the BNNT initial yarn across the spool, forming a crossing pattern on the spool as shown in FIG. 10A.

Numerous spooling techniques may be used to simplify the removal of BNNT initial yarn from the spool without damaging or destroying the BNNT initial yard. For example, BNNT initial yarn from one circuit around the spool may be separated by the diameter of at least one BNNT initial yarn, from adjacent yarns. Additionally, a BNNT initial yarn may be spooled at an angle relative to any other BNNT initial yarns that it contacts, by at least 5 degrees or more. These separations and angles are controlled by the relative speeds of spool rotation and the cyclic movement back and forth of the spool along its axis.

The BNNT initial yarn may be, in some embodiments, optically observable along the entire length of the path downstream of self-assembly. The BNNT initial yarn position and speed may be measured by cameras, for example, although other sensor technologies may be used. Feedback from the cameras or other sensors may be provided a controller operating one or more of (1) the angular rotation speed of the spool, (2) the heat source power as it varies the amount of heat and thereby the convective motion of the nitrogen gas carrying the BNNT initial yarn, (3) the cooling of the nitrogen gas, and (4) the settings of the dampers in locations B, C, D and E. Variables (3) and (4) may also vary the convective flow, and thereby vary the tension in the BNNT initial yarn. These parameters allow for providing slight tension in the BNNT initial yarn, matching the BNNT initial yarn speed approaching the spool to the spool's tangential speed, assists with continued BNNT initial yarn spooling, and allows for adjustments to any changes in the boron feedstock, such as, for example in a continuous process, the boron ball size during evaporation and subsequent replenishment by the boron feeding mechanism.

Figure 10B:
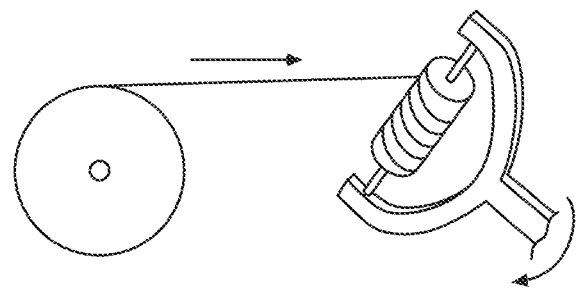
Figure 10C:
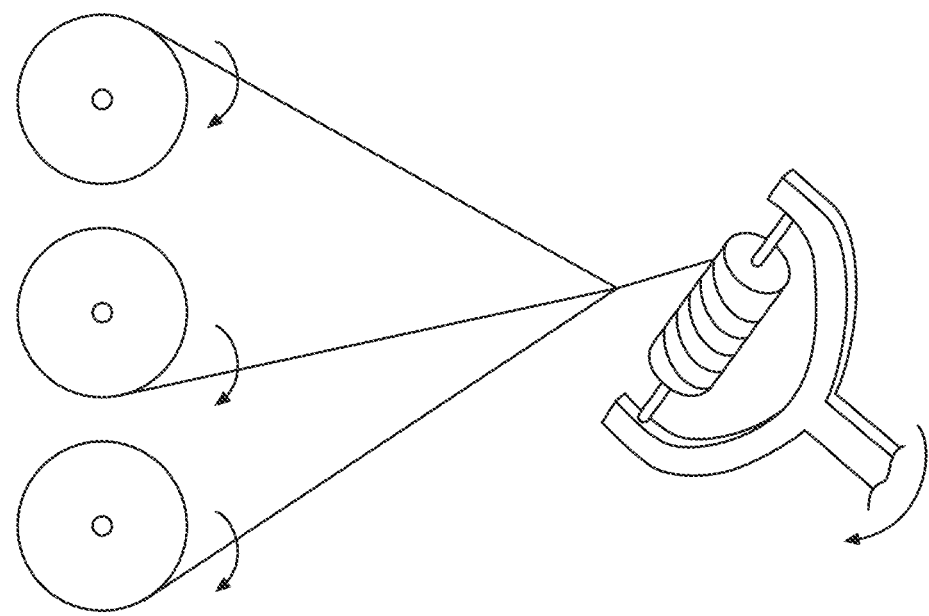
Figure 11A:
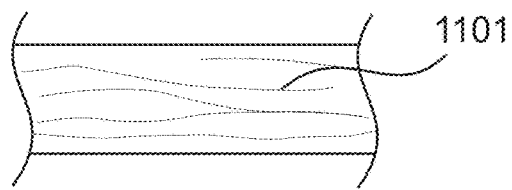
FIGS. 11A-11E show drawings of various BNNT yarns.
Figure 11B:
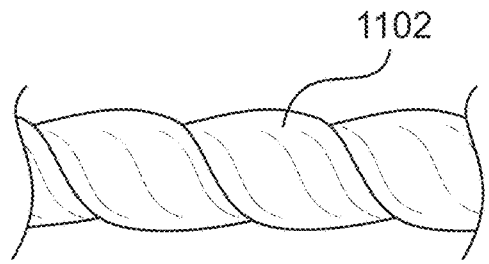
Figure 11C:
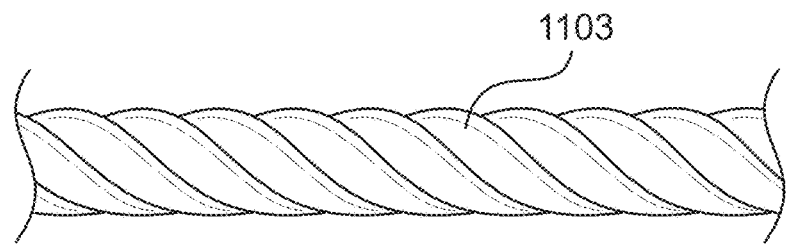
Figure 11D:
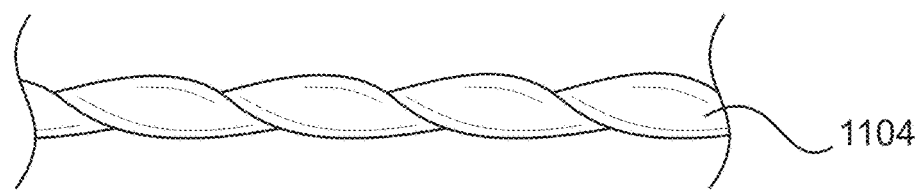
Figure 11E:
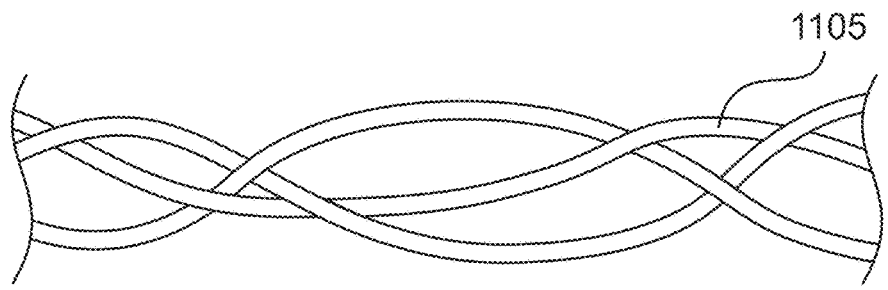

The following discussion relates to the preparation of BNNT yarns from BNNT initial yarns. After collection using an apparatus as described above, BNNT initial yarn collected on a spool may be de-spooled or removed. The process may be mechanical or manual. The de-spooled BNNT initial yarn may be re-spooled onto a new spool to form BNNT yarn as shown in FIGS. 10B and 10C. Composites and coatings may be applied to the BNNT initial yarn during re-spooling to form coated BNNT yarn. Composites and coatings such as ceramics, polymers and metals, for example, may more effectively bind to the BNNT fibers at the molecular level when applied during re-spooling and BNNT yarn formation. FIG. 10B shows a re-spooling process in which BNNT initial yarn from a single initial spool is re-spooled on a new spool. The BNNT initial yarn may be twisted during the re-spooling process. Alternatively, as shown in FIG. 10B, the new spool may be rotated during re-spooling to cause the BNNT initial yarn to twist during spooling.

In some embodiments, multiple spools of BNNT initial yarn may be used to generate BNNT yarn. FIG. 10C shows multiple spools of BNNT initial yarns being de-spooled from the initial spool, pulled through guide structures, and re-spooled together on a new spool. The initial spools may be rotated, to cause the individual BNNT initial yarns to twist, and the new spool may rotate, to twist the individual BNNT initial yarns together and form a new multi-BNNT initial yarn into a BNNT yarn.

Twisting the BNNT yarn from the initial spool increases the density of BNNT strands, i.e. number of strands per unit of cross sectional area. Twisting BNNT strands and BNNT initial yarns may shorten the BNNT yarn, due to the helical shape caused by the twisting process. Also, the twisting process may lengthen the yarn by enhancing BNNT strand alignment, particularly if the twisting and re-spooling process occurs under an increased tension in the BNNT initial yarn. Varying these conditions varies the properties of the final BNNT yarn such as strength, thermal conductivity and bonding to compositing and coating materials.

The methods described herein may be used to produce closely-aligned BNNT fibers, BNNT strands and BNNT initial yarns. The close alignment provides significant physical properties. For example, BNNT initial yarns and BNNT yarns made as described herein may have both enhanced strength and enhanced thermal conductivity. The enhanced strength results from the close alignment of the BNNT fibers, thereby providing enhanced bonding at the molecular level of the multiple BNNT fibers. Enhanced thermal conductivity, particularly in the direction of the length, direction of alignment, of the BNNT yarn results from the close alignment of the BNNT fibers and BNNT strands. The close alignment enhances phonon coupling or transfer at the molecular level between the multiple BNNT fibers.

The BNNT initial yarn and BNNT yarn, including weaves and ropes made of BNNT initial yarn and BNNT yarn, may be composited with materials such as ceramics, metals and polymers. The compositing and/or coating may take place at any location in the process(es) of producing the BNNT initial yarn, BNNT yarn, BNNT weaves and/or BNNT ropes, including for example where the BNNT initial yarn forms, where it is spooled, where it is spun into BNNT yarn, and/or where it is unwound and woven into weaves and/or ropes. The method of compositing will depend on, among other factors, the type of material(s) being composited, and where in the BNNT material process the compositing occurs. FIG. 11A-11E show examples of BNNT initial yarn 1101, loosely wound BNNT yarn 1102, loosely wound multiple BNNT initial yarns into a BNNT yarn and/or BNNT rope 1103, the BNNT yarn and/or rope in 1103 that has been stretched 1104 and three separate BNNT yarns woven into a simple flat weave 1105. These are only a few representative options for combining BNNT initial yarns into BNNT yarns, BNNT ropes, and/or BNNT weaves, for example the number of BNNT yarns woven into a weave could be a larger number, i.e. 4, 5, 6, 7, etc.

Figure 12A:
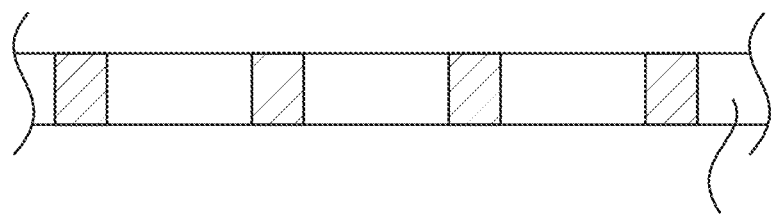
FIGS. 12A-12C show various BNNT yarns with coatings.
Figure 12B:
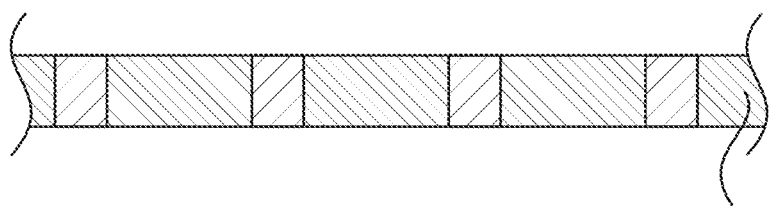
Figure 12C:
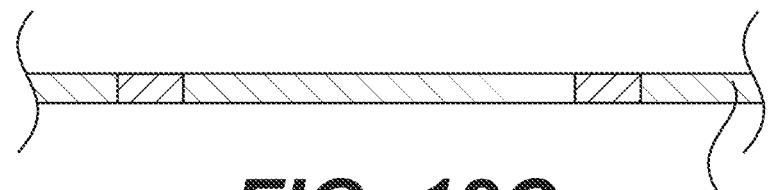

As shown in FIGS. 12A-12C, the BNNT initial yarn, BNNT yarn, BNNT rope, and/or BNNT weave (these structures are generally referenced as "BNNT structures" hereinafter) can be composited with other materials, such as ceramics, metals, and polymers, including combinations thereof, along any length of the BNNT structure. FIGS. 12A-12C show an embodiment in which a first compositing material has been added to a BNNT structure 1201, and the initial composite locations are periodic along the length of the BNNT structure 1201. Of course, the compositing pattern may be any variation suitable for the intended application. FIGS. 12A-12C also show a second embodiment in which a second compositing material has been added at the un-composited locations along the BNNT structure 1201 to form a multi-coated BNNT structure 1202. The second compositing material may be added during the same step as the first compositing material, or may be added after initial compositing action. For example, the first compositing material could be a metal such as aluminum, and the second compositing material could be a ceramic or polymer. The compositing process may be continued such that three or more compositing materials have been composited on the BNNT structure. The plurality of compositing materials may be periodically located, or the sequence and patterning may be selected to be suitable for the intended use(s). The sequence of composited materials may be determined by the combination of temperature, chemical reactions, etc. that are required to integrate a specific composited material. For example, a spark sintering process might be utilized to integrate/composite a ceramic, and then a high temperature laser process might be utilized to integrate/composite a metal, or a UV light or plasma beam interacting with the BNNT yarn and an epoxy might be utilized to integrate/composite the epoxy into the BNNT structure.

Finally, FIGS. 12A-12C show that in some instances the composited BNNT structure 1203 may be stretched at any one or more stages in the process. The stretching step enhances the interaction between BNNT material components via enhanced overlap of the multiple BNNT fibers that make up the BNNT strands that in turn make up the BNNT initial yarn, BNNT yarn, BNNT rope and/or BNNT weave. The enhanced interactions enhance the thermal conductivity and the strength of the final composite.

The final composited BNNT initial yarn, BNNT yarn, BNNT rope, and/or BNNT weave may be cut into multiple pieces such that one or more of the pieces or segments can be utilized. For example, a piece that is a composite of BNNT yarn with aluminum and a polymer might be placed in a diode, LED, transistor, or Integrated Circuit (IC) to enhance the thermal conductivity, and thereby lower the junction temperature(s), and thereby enhance the lifetime and efficiency of the electronic component Multiple segments of a BNNT structure can be integrated into a single electronic component if desired.

The processes for compositing the BNNT initial yarn, BNNT yarn, BNNT rope, and/or BNNT weave with ceramics, metals and/or ceramics can be fully automated and integrated into the same processes used for creation of the BNNT initial yarn, BNNT yarn, BNNT rope and/or BNNT weave.

Figure 13:
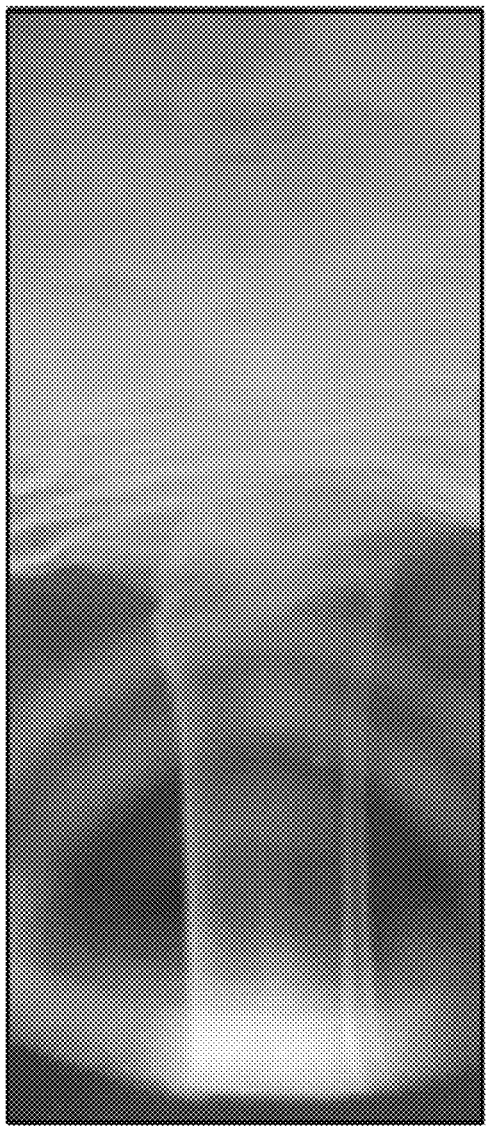
FIG. 13 is an image of a BNNT self-assembly region in a prototype embodiment, feeding into a BNNT "cotton ball" of BNNT fibers and some BNNT strands.
Figure 14:
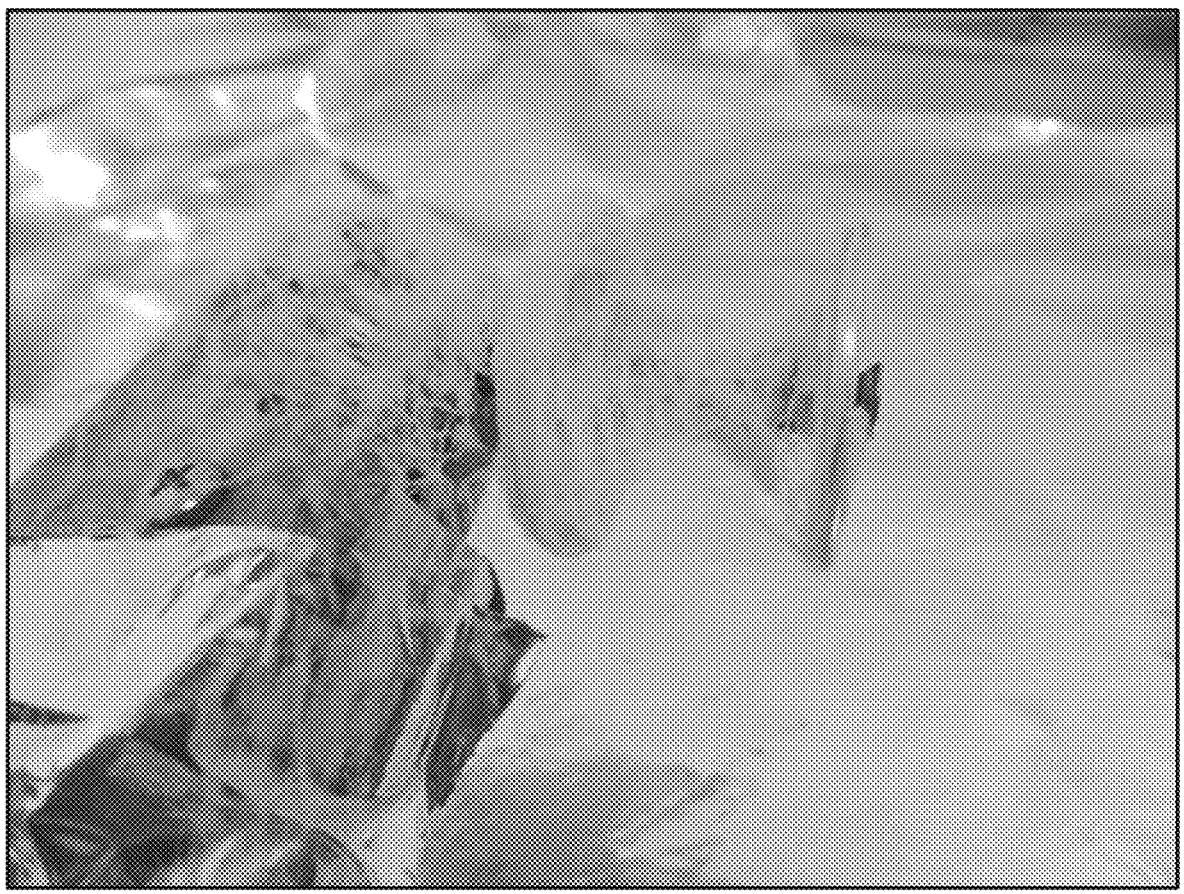
FIG. 14 shows BNNT initial yarn acquired on a variable diameter spool.
Figure 15:
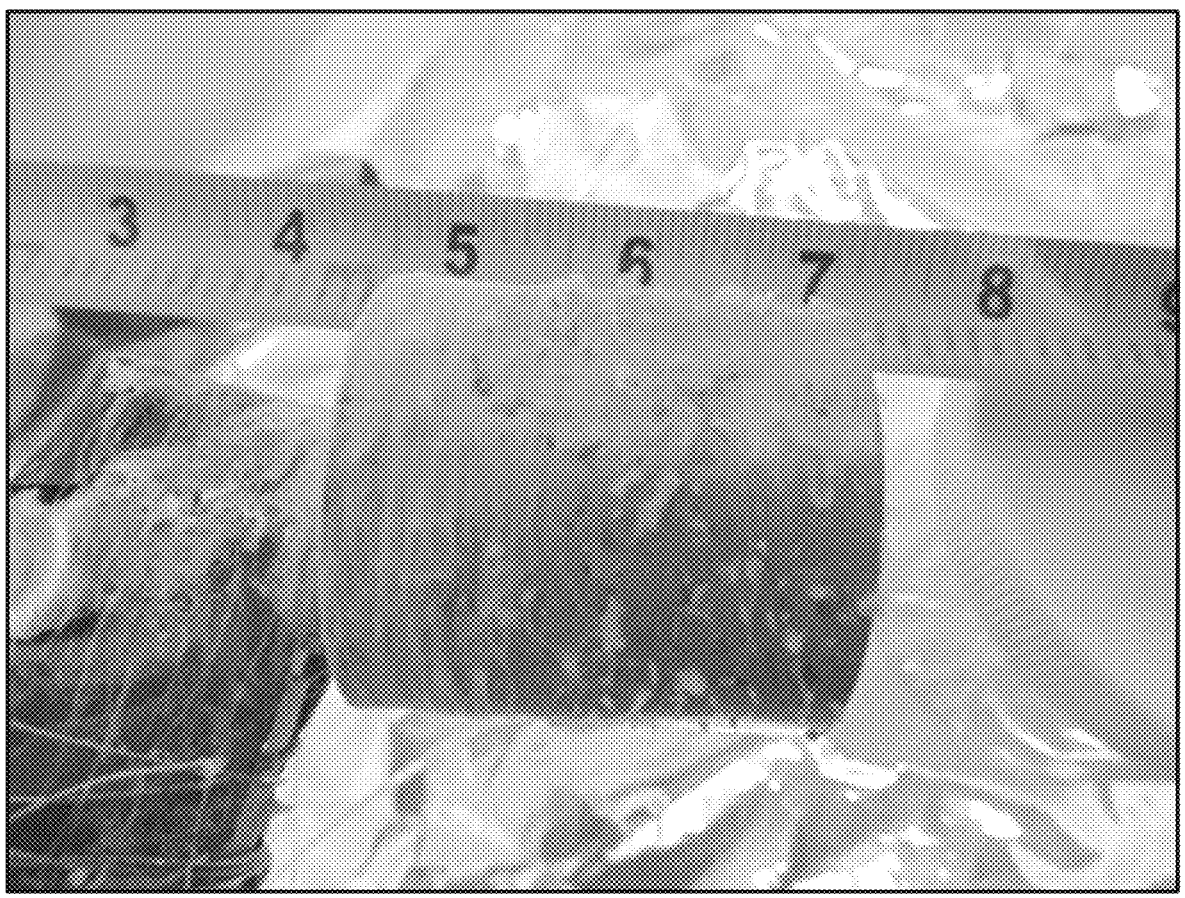
FIG. 15 shows BNNT initial yarn acquired on a cylindrical spool.

Experimental results for prototype apparatus embodiments for forming BNNT fibers, BNNT strands and BNNT initial yarns are shown in FIGS. 13, 14, and 15. In FIG. 13 the growth zone (Zone 1) is generally located where BNNT fibers are self-assembled, just above the boron melt. In this instance, the BNNT fibers directly feed into a "cotton ball" of BNNT, i.e. BNNT strands are beginning to form when the BNNT fibers are embedded into the BNNT "cotton ball." FIGS. 14 and 15 show BNNT initial yarns collected on spools. In the embodiment utilized in FIG. 14, the spool was of variable diameter so as to be able to more easily investigate the velocity of the BNNT initial yarn. In the embodiment utilized in FIG. 15 a constant diameter spool was utilized. The spools shown in FIGS. 14 and 15 were placed sufficiently far from the boron melt such that all three zones were present in the process, i.e. Zone 1 for BNNT fiber growth/self-assembly (as shown in FIG. 13), an interference zone or Zone 2 for the BNNT strand formation, and a stretch zone or Zone 3 for the BNNT initial yarn formation. The images shown in FIG. 9 were taken from material collected by the embodiment shown in FIG. 15.

The principles described herein may be embodied in other specific forms without departing from the spirit or characteristics thereof. The present embodiments are therefore to be considered in all respects as illustrative and not restrictive, the scope of the invention being indicated by the claims of the application rather than by the foregoing description, and all changes which come within the meaning and range of equivalency of the claims are therefore intended to be embraced therein.

The terminology used herein is for the purpose of describing particular embodiments only and is not intended to be limiting of the approach. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. An apparatus for producing aligned boron nitride nanotube (BNNT) fibers, the apparatus comprising:
    a chamber providing a boron feedstock mounting surface, the mounting surface housing a boron feedstock and configured to support a boron melt;
    a nitrogen gas supply system containing nitrogen gas and configured to feed nitrogen gas at an elevated pressure to the chamber and to direct the gas through the chamber in a first direction;
    a heat source configured to target and supply heat to a boron feedstock on the mounting structure, wherein the heat source provides heat into the chamber sufficient to convert the boron feedstock into a boron melt; and
    wherein the chamber defines a growth zone region downstream of the mounting structure in the first direction, the growth zone region having a first volume and a first cross-sectional area configured to allow BNNT self-assembly in a nitrogen gas flow downstream of the feedstock mounting surface in the first direction;
    wherein the chamber defines an interference zone region downstream of the growth zone region in the first direction, the interference zone region having a second volume and a second cross-sectional area configured to allow self-assembled BNNT fibers flowing from the growth zone region to form BNNT strands, the second cross-sectional area less than the first cross-sectional area;
    wherein the chamber further defines a collection region downstream of the growth zone region and the interference zone region in the first direction, the collection region having a spooling mechanism configured to collect BNNT strands flowing from the interference zone region.

2. The apparatus of claim 1, wherein the chamber further comprises a stretch zone region downstream of the interference zone region and upstream of the collection region in the first direction, the stretch zone region configured for BNNT strands flowing from the interference zone increase in length and decrease in diameter.

3. The apparatus of claim 2, wherein the spooling mechanism is configured to increase the velocity of BNNTs in the stretch zone.

4. The apparatus of claim 1, wherein the heat source is configured to establish a heat distribution profile to form a BNNT growth zone in the growth zone region.

5. The apparatus of claim 4, wherein the heat source is configured to thermally excite a portion of the boron feedstock to form a BNNT melt and a BNNT self-assembly flux distribution in the growth zone region that generates a desired level of BNNT alignment.

6. The apparatus of claim 1, further comprising a fan upstream of the mounting surface and configured to control the velocity distribution of the nitrogen gas in a plane perpendicular to the flow of the nitrogen gas.

7. The process of claim 1, wherein the nitrogen gas supply system is configured to establish a velocity distribution of nitrogen gas in a plane perpendicular to the first direction.

8. An apparatus for producing aligned boron nitride nanotube (BNNT) fibers, the apparatus comprising:
    a chamber providing a boron feedstock mounting surface, the mounting surface housing a boron feedstock and configured to support a boron melt;
    a nitrogen gas supply system containing nitrogen gas and configured to feed nitrogen gas at an elevated pressure to the chamber and to direct the gas through the chamber in a first direction;
    a heat source configured to target and supply heat to_a boron feedstock on the mounting structure, wherein the heat source provides heat into the chamber sufficient to convert the boron feedstock into a boron melt; and
    wherein the chamber defines:
        a growth zone region downstream of the mounting structure in the first direction, the growth zone region having a first volume and a first cross-sectional area configured to allow BNNT self-assembly in a nitrogen gas flow downstream of the feedstock mounting surface in the first direction;
        an interference zone region downstream of the grown zone region in the first direction, the interference zone region having a second volume and a second cross-sectional area configured to allow self-assembled BNNT fibers flowing from the growth zone region to form BNNT strands; and
        a collection region downstream of the growth zone region and the interference zone region in the first direction, the collection region having a spooling mechanism configured to collect BNNT strands flowing from the interference zone region.

9. The apparatus of claim 8, wherein the second volume and a second cross-sectional area are configured to increase the volumetric flow rate of nitrogen gas through the interference zone region relative to the volumetric flow rate of nitrogen gas through the growth zone region, the second cross-sectional area less than the first cross-sectional area.

10. The apparatus of claim 8, wherein the heat source is configured to supply heat to the chamber in a direction perpendicular to the first direction.

11. The apparatus of claim 8, wherein the heat source is configured to supply heat to an upper region of a boron melt on the mounting surface.

12. The apparatus of claim 9, wherein the chamber further comprises a stretch zone region downstream of the interference zone region and upstream of the collection region in the first direction, the stretch zone region configured for BNNT strands flowing from the interference zone increase in length and decrease in diameter.

13. The apparatus of claim 9, further comprising a second heat source configured to supply heat to the growth zone region.

14. The apparatus of claim 9, wherein the heat source is further configured to supply heat to the growth zone region.

15. An apparatus for producing aligned boron nitride nanotube (BNNT) fibers, the apparatus comprising:
- a chamber providing a boron feedstock mounting surface, the mounting surface housing a boron feedstock and configured to support a boron melt;
- a nitrogen gas supply system containing nitrogen gas and configured to feed nitrogen gas at an elevated pressure to the chamber and to direct the gas through the chamber in a first direction;
- a heat source for thermally exciting a boron feedstock on the mounting structure, wherein the heat source provides heat into the chamber sufficient to convert the boron feedstock into a boron melt; and wherein the chamber includes:
- a growth zone region downstream of the mounting structure in the first direction, the growth zone region having a first volume and a first cross-sectional area configured to allow BNNT self-assembly in a nitrogen gas flow downstream of the feedstock mounting surface in the first direction;
- an interference zone region downstream of the grown zone region in the first direction, the interference zone region having a second volume and a second cross-sectional area configured to allow self-assembled BNNT fibers flowing from the growth zone region to form BNNT strands, the second cross-sectional area less than the first cross-sectional area;
- a stretch zone region downstream of the interference zone region in the first direction, the stretch zone region configured for BNNT strands flowing from the interference zone to increase in length and decrease in diameter; and
- a collection region downstream of the stretch zone region in the first direction, the collection region having a spooling mechanism configured to collect BNNT strands flowing from the interference zone region.

16. The apparatus of claim 15, wherein the heat source is configured to supply heat to the chamber in a direction perpendicular to the first direction.

17. The apparatus of claim 15, wherein the heat source is further configured to supply heat to the growth zone region.

18. The apparatus of claim 15, wherein the stretch zone includes a spooling mechanism configured to increase the velocity of BNNTs in the stretch zone.

* * * * *